US011005026B2

(12) United States Patent
Ohashi

(10) Patent No.: US 11,005,026 B2
(45) Date of Patent: May 11, 2021

(54) PIEZOELECTRIC ELEMENT, PIEZOELECTRIC ACTUATOR, ULTRASONIC PROBE, ULTRASONIC APPARATUS, ELECTRONIC APPARATUS, LIQUID EJECTION HEAD, AND LIQUID EJECTION DEVICE

(71) Applicant: Seiko Epson Corporation, Tokyo (JP)

(72) Inventor: Koji Ohashi, Matsumoto (JP)

(73) Assignee: Seiko Epson Corporation

( * ) Notice: Subject to any disclaimer, the term of this patent is extended or adjusted under 35 U.S.C. 154(b) by 680 days.

(21) Appl. No.: 15/846,621

(22) Filed: Dec. 19, 2017

(65) Prior Publication Data

US 2018/0204997 A1   Jul. 19, 2018

(30) Foreign Application Priority Data

Jan. 17, 2017   (JP) .............................. JP2017-006213

(51) Int. Cl.
| | |
|---|---|
| *H01L 41/053* | (2006.01) |
| *H01L 41/047* | (2006.01) |
| *H01L 41/04* | (2006.01) |
| *B41J 2/14* | (2006.01) |
| *B06B 1/02* | (2006.01) |

(Continued)

(52) U.S. Cl.
CPC ........ *H01L 41/0533* (2013.01); *B06B 1/0207* (2013.01); *B06B 1/0644* (2013.01); *B41J 2/14201* (2013.01); *B41J 2/14233* (2013.01); *H01L 41/042* (2013.01); *H01L 41/047* (2013.01); *H01L 41/0471* (2013.01); *H01L 41/081* (2013.01); *H01L 41/09* (2013.01); *B41J 2002/14241* (2013.01); *B41J 2002/14491* (2013.01)

(58) Field of Classification Search
CPC ............... H01L 41/0533; H01L 41/047; H01L 41/0471; H01L 41/042; H01L 41/081; B41J 2/14201; B41J 2/14233
USPC .......................................................... 310/328
See application file for complete search history.

(56) References Cited

U.S. PATENT DOCUMENTS

| | | | |
|---|---|---|---|
| 9,022,533 B2 | 5/2015 | Yazaki et al. | |
| 2009/0244206 A1 | 10/2009 | Nakayama | |

(Continued)

FOREIGN PATENT DOCUMENTS

| | | |
|---|---|---|
| JP | 2009-252757 A | 10/2009 |
| JP | 2012-038808 A | 2/2012 |

(Continued)

*Primary Examiner* — Derek J Rosenau
(74) *Attorney, Agent, or Firm* — Harness, Dickey & Pierce, P.L.C.

(57) ABSTRACT

A piezoelectric element includes a first electrode layer, a piezoelectric body layer, and a second electrode layer laminated in this order, and a conductive layer that is located from the first electrode layer to the piezoelectric body layer, in which the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and in which a thickness of at least a part of the third portion is smaller than a thickness of the first portion.

9 Claims, 13 Drawing Sheets

(51) Int. Cl.
 *B06B 1/06* (2006.01)
 *H01L 41/09* (2006.01)
 *H01L 41/08* (2006.01)

(56) References Cited

U.S. PATENT DOCUMENTS

| | | |
|---|---|---|
| 2012/0030915 A1 | 2/2012 | Shimizu et al. |
| 2014/0013676 A1 | 1/2014 | Freitag et al. |
| 2014/0176646 A1 | 6/2014 | Hirai et al. |
| 2014/0267511 A1* | 9/2014 | Yazaki .................. B41J 2/1631 347/71 |
| 2014/0290828 A1* | 10/2014 | Zhang .................. H01L 41/277 156/73.6 |
| 2014/0296716 A1 | 10/2014 | Kiyose et al. |
| 2016/0282454 A1 | 9/2016 | Ohashi et al. |

FOREIGN PATENT DOCUMENTS

| | | |
|---|---|---|
| JP | 2012-231055 A | 11/2012 |
| JP | 2014-112646 A | 6/2014 |
| JP | 2014-121799 A | 7/2014 |
| JP | 2014-172392 A | 9/2014 |
| JP | 2014-195494 A | 10/2014 |
| JP | 2016-096257 A | 5/2016 |
| JP | 2016-181842 A | 10/2016 |

\* cited by examiner

PIEZOELECTRIC ELEMENT, PIEZOELECTRIC ACTUATOR, ULTRASONIC PROBE, ULTRASONIC APPARATUS, ELECTRONIC APPARATUS, LIQUID EJECTION HEAD, AND LIQUID EJECTION DEVICE

BACKGROUND

1. Technical Field

The present invention relates to a piezoelectric element, a piezoelectric actuator, an ultrasonic probe, an ultrasonic apparatus, an electronic apparatus, a liquid ejection head, and a liquid ejection device.

2. Related Art

In the related art, there is an ultrasonic transducer including a vibration film and a piezoelectric element provided on the vibration film (for example, JP-A-2014-195494).

The piezoelectric element is formed as a laminate of a lower electrode, a piezoelectric film, and an upper electrode, and a region in which the lower electrode, the piezoelectric film, and the upper electrode overlap each other in a laminate direction is a region in which deformation occurs when a voltage is applied between the electrodes (hereinafter, also referred to as an active section). In the ultrasonic transducer, the vibration film vibrates due to deformation of the active section when a voltage is applied, and thus an ultrasonic wave is transmitted.

However, in the piezoelectric element disclosed in JP-A-2014-195494, if the active section is deformed during driving, a difference occurs between deformation amounts of the active section and a portion (inactive section) other than the active section, and thus there is concern that the stress may be applied to the piezoelectric film, and a crack may occur in a part of the piezoelectric film.

For example, in the piezoelectric film, the stress is alleviated by the upper electrode in a portion (coated portion) covered with the upper electrode. On the other hand, in a portion (non-coated portion) not covered with the upper electrode, there is no alleviation of stress due to the upper electrode, and thus the crack more easily occurs than in the coated portion.

There is concern that the stress may concentrate on a boundary position between the active section and the inactive section in a plan view which is viewed from a laminate direction. Thus, in a case where the piezoelectric film is provided to straddle a position overlapping an end of the upper electrode forming the boundary position of the active section, there is concern that a crack may occur in the piezoelectric film around the boundary position in the inactive section. If water permeates into the crack, there is concern that the piezoelectric film may be burnt due to conduction between the lower electrode and the upper electrode, and thus the performance of the piezoelectric element may deteriorate.

SUMMARY

An advantage of some aspects of the invention is to provide a piezoelectric element, a piezoelectric actuator, ultrasonic probe, an ultrasonic apparatus, an electronic apparatus, a liquid ejection head, and a liquid ejection device, capable of suppressing performance deterioration of a piezoelectric film due to a crack.

A piezoelectric element according to an application example of the invention is a piezoelectric element in which a first electrode layer, a piezoelectric body layer, and a second electrode layer are laminated in this order, the piezoelectric element including a conductive layer that is located from the first electrode layer to the piezoelectric body layer, in which the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and in which a thickness of at least a part of the third portion is smaller than a thickness of the first portion.

Here, the first portion of the piezoelectric body layer is a portion overlapping the second electrode layer, and interposed between the first electrode layer and the second electrode layer. The first portion is an active section which is deformed when the piezoelectric element is driven by applying a voltage between the first electrode layer and the second electrode layer. On the other hand, the second portion and the third portion are portions not overlapping at least the second electrode layer, and a voltage is not applied thereto when the piezoelectric element is driven. In other words, the second portion and the third portion are an inactive section with respect to the active section.

As described above, the stress is applied to the piezoelectric body layer due to deformation of the active section when the piezoelectric element is driven, and thus there is concern that a crack may occur in the piezoelectric body layer. In contrast, in the application example, the second electrode layer is laminated on the first portion, the conductive layer is laminated on the second portion, and thus the stress applied thereto is alleviated. Thus, it is possible to suppress the occurrence of a crack in the first portion and the second portion due to the stress. A thickness of at least a part of the third portion is smaller than a thickness of the first portion including the active section, and thus the third portion can be easily deformed according to deformation of the active section. Thus, it is possible to suppress the occurrence of a crack in the third portion due to the stress. Therefore, according to the application example, it is possible to suppress the occurrence of a crack in the piezoelectric body layer, further to suppress the occurrence of burning, and thus to prevent deterioration in the performance of the piezoelectric element.

In the piezoelectric element according to the application example, it is preferable that a thickness of the third portion is smaller than a thickness of the first portion at a position including at least a boundary with the first portion in the plan view.

In the application example with this configuration, a thickness of the third portion is smaller than a thickness of the first portion at a position including at least a boundary with the first portion in the plan view. In other words, a thickness of the third portion is smaller than a thickness of the first portion at a position along at least an end of the second electrode layer in the plan view. Consequently, it is possible to more easily deform a peripheral position of the boundary with the first portion on which the stress concentrates when the active section is driven, in the third portion of the piezoelectric body layer. Therefore, in the boundary, it is possible to more reliably suppress the occurrence of a crack in the piezoelectric body layer, and also to more reliably suppress burning of the piezoelectric body layer.

In the piezoelectric element according to the application example, it is preferable that a thickness of the third portion is gradually reduced as the third portion becomes more distant from the boundary in the plan view.

In the application example with this configuration, a thickness of the third portion is gradually reduced as the third portion becomes more distant from the boundary in the plan view. In this configuration, it is possible to prevent the stress from concentrating on the boundary of the third portion compared with a case where, for example, a corner portion such as a step difference on which the stress easily concentrates is formed at the boundary between the first portion and the third portion or in the vicinity thereof. Therefore, it is possible to more reliably suppress the occurrence of a crack in the boundary of the piezoelectric body layer, and also to more reliably suppress burning of the piezoelectric body layer.

In the piezoelectric element according to the application example, it is preferable that the third portion has a groove located between the first portion and the second portion in the plan view.

In the application example with this configuration, the third portion has a groove located between the first portion and the second portion, and thus it is possible to more reliably insulate the second electrode layer and the conductive layer from each other. For example, if a distance between the first portion and the second portion is short, that is, a distance between the second electrode layer and the conductive layer is short, in a case where water is attached to a surface of the third portion of the piezoelectric body layer, the second electrode layer and the conductive layer may be electrically connected to each other. In contrast, since the groove is formed, an actual distance along a groove inner surface can be increased more than a planar distance between the second electrode layer and the conductive layer, and thus it is possible to more reliably obtain the above-described insulation.

In the piezoelectric element according to the application example, it is preferable that an inner surface of the groove is curved.

In the application example with this configuration, since an inner surface of the groove is curved, it is possible to prevent the stress from concentrating on the third portion compared with a case where a corner portion on which the stress easily concentrates is formed on the inner surface of the groove. Therefore, it is possible to more reliably suppress the occurrence of a crack in the piezoelectric body layer, and also to more reliably suppress burning of the piezoelectric body layer.

In the piezoelectric element according to the application example, it is preferable that a thickness of at least a part of the second portion is smaller than a thickness of the first portion.

In the application example with this configuration, a thickness of at least a part of the second portion is smaller than a thickness of the first portion. In this configuration, the second portion can also be easily deformed along with the third portion, and thus it is possible to more reliably suppress the occurrence of a crack in the third portion due to the stress concentrating on the third portion.

A piezoelectric actuator according to an application example of the invention includes a piezoelectric element in which a first electrode layer, a piezoelectric body layer, and a second electrode layer are laminated in this order on the vibration film; and a drive portion that is driven by the piezoelectric element, in which the piezoelectric element includes a conductive layer that is located from the first electrode layer to the piezoelectric body layer, in which the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and in which a thickness of at least a part of the third portion is smaller than a thickness of the first portion.

In the same manner as in the application example related to the piezoelectric element, in the application example, the second electrode layer is laminated on the first portion, the conductive layer is laminated on the second portion, and thus the stress applied thereto is alleviated. Thus, it is possible to suppress the occurrence of a crack in the first portion and the second portion due to the stress. A thickness of at least a part of the third portion is smaller than a thickness of the first portion including the active section, and thus the third portion can be easily deformed according to deformation of the active section. Thus, it is possible to suppress the occurrence of a crack in the third portion due to the stress. Therefore, according to the application example, it is possible to suppress the occurrence of a crack or burning in the piezoelectric body layer, and thus to prevent deterioration in the performance of the piezoelectric element and also to prevent deterioration in the performance of the piezoelectric actuator.

In the piezoelectric actuator according to the application example, it is preferable that the drive portion is a vibration film, and the piezoelectric element is provided on the vibration film.

In the application example with this configuration, the piezoelectric element is provided on the vibration film, and thus the vibration film can be caused to vibrate according to driving of the piezoelectric element. In the piezoelectric actuator, the piezoelectric element is provided on the vibration film which can vibrate, and thus the stress is easily applied to the piezoelectric element. In contrast, in the application example, in the same manner as in the above-described application example, even in a case where the stress is applied to the piezoelectric element, it is possible to suppress the occurrence of a crack in the piezoelectric body layer. Therefore, even in a case where the piezoelectric body layer is deformed in a vibration direction, it is possible to suppress the occurrence of a crack in the piezoelectric body layer, further to suppress the occurrence of burning, and thus to prevent deterioration in the performance of the piezoelectric element.

An ultrasonic probe according to an application example of the invention includes a vibration film; a piezoelectric element in which a first electrode layer, a piezoelectric body layer, and a second electrode layer are laminated in this order on the vibration film; and a casing in which the vibration film and the piezoelectric element are stored, in which the piezoelectric element includes a conductive layer that is located from the first electrode layer to the piezoelectric body layer, in which the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and in which a thickness of at least a part of the third portion is smaller than a thickness of the first portion.

In the same manner as in the application example related to the piezoelectric element, in the application example, the second electrode layer is laminated on the first portion, the conductive layer is laminated on the second portion, and thus the stress applied thereto is alleviated. Thus, it is possible to suppress the occurrence of a crack in the first portion and the second portion due to the stress. A thickness of at least a part of the third portion is smaller than a thickness of the first portion including the active section, and thus the third portion can be easily deformed according to deformation of the active section. Thus, it is possible to suppress the occurrence of a crack in the third portion due to the stress. Therefore, according to the application example, it is possible to suppress the occurrence of a crack or burning in the piezoelectric body layer, and thus to prevent deterioration in the performance of the piezoelectric element and also to prevent deterioration in the performance of the ultrasonic probe.

An ultrasonic apparatus according to an application example of the invention includes a vibration film; a piezoelectric element in which a first electrode layer, a piezoelectric body layer, and a second electrode layer are laminated in this order on the vibration film; and a controller that controls the piezoelectric element, in which the piezoelectric element includes a conductive layer that is located from the first electrode layer to the piezoelectric body layer, the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and in which a thickness of at least a part of the third portion is smaller than a thickness of the first portion.

In the same manner as in the application example related to the piezoelectric element, in the application example, the second electrode layer is laminated on the first portion, the conductive layer is laminated on the second portion, and thus the stress applied thereto is alleviated. Thus, it is possible to suppress the occurrence of a crack in the first portion and the second portion due to the stress. A thickness of at least a part of the third portion is smaller than a thickness of the first portion including the active section, and thus the third portion can be easily deformed according to deformation of the active section. Thus, it is possible to suppress the occurrence of a crack in the third portion due to the stress. Therefore, according to the application example, it is possible to suppress the occurrence of a crack or burning in the piezoelectric body layer, and thus to prevent deterioration in the performance of the piezoelectric element and also to prevent deterioration in the performance of the ultrasonic apparatus.

An electronic apparatus according to an application example of the invention includes a piezoelectric element in which a first electrode layer, a piezoelectric body layer, and a second electrode layer are laminated in this order; a controller that controls the piezoelectric element; and a drive portion that is driven by the piezoelectric element, in which the piezoelectric element includes a conductive layer that is located from the first electrode layer to the piezoelectric body layer, in which the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and in which a thickness of at least a part of the third portion is smaller than a thickness of the first portion.

In the application example, the electronic apparatus includes the piezoelectric element of the above-described application example, the drive portion which is driven by the piezoelectric element, and the controller which controls the piezoelectric element.

Therefore, in the same manner as in the above-described application example, it is possible to suppress the occurrence of a crack or burning in the piezoelectric body layer, and thus to prevent deterioration in the performance of the piezoelectric element. Thus, it is possible to prevent deterioration in the performance of the electronic apparatus.

A liquid ejection head according to an application example of the invention includes the piezoelectric actuator according to the application example described above.

In the application example, the liquid ejection head includes the same piezoelectric body layer as in the above-described application example. Therefore, it is possible to suppress the occurrence of a crack or burning in the piezoelectric body layer, and thus to prevent deterioration in the performance of the piezoelectric element and also to prevent deterioration in the performance of the liquid ejection head.

A liquid ejection device according to an application example of the invention includes the liquid ejection head according to the application example.

In the application example, the liquid ejection head provided in the liquid ejection device includes the same piezoelectric element as in the above-described application example. Therefore, it is possible to suppress the occurrence of a crack or burning in the piezoelectric body layer, and thus to prevent deterioration in the performance of the piezoelectric element and also to prevent deterioration in the performance of the liquid ejection device including the liquid ejection head.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, an ultrasonic measurement apparatus according to a first embodiment will be described with reference to the drawings.

Figure 1:
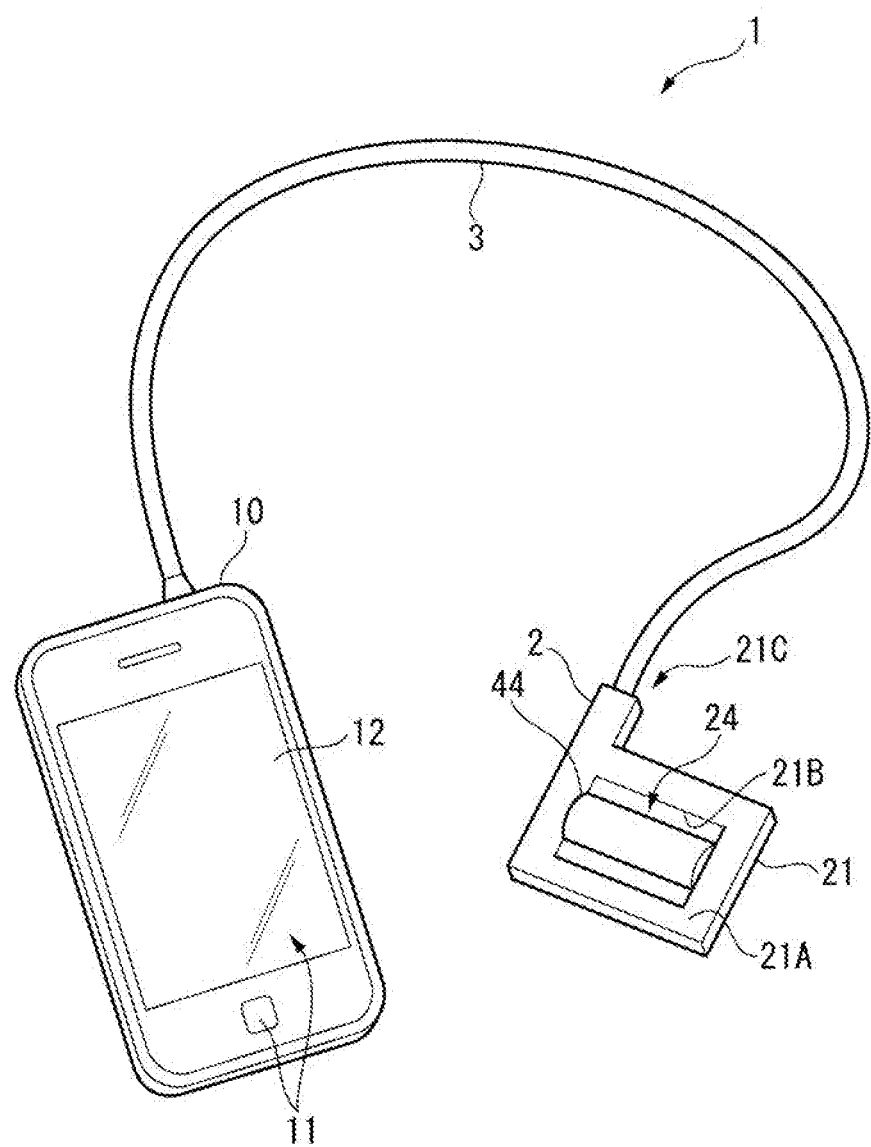
FIG. 1 is a perspective view illustrating a schematic configuration of an ultrasonic measurement apparatus according to a first embodiment.

FIG. 1 is a perspective view illustrating a schematic configuration of an ultrasonic measurement apparatus 1.

As illustrated in FIG. 1, the ultrasonic measurement apparatus 1 includes an ultrasonic probe 2 and a control device 10 electrically connected to the ultrasonic probe 2 via a cable 3.

The ultrasonic measurement apparatus 1 sends ultrasonic waves into a living body from the ultrasonic probe 2 in a state in which the ultrasonic probe 2 is brought into contact with a surface of the living body (human body). Ultrasonic waves reflected from an organ in the living body are received by the ultrasonic probe 2, and, for example, an internal tomographic image of the living body is obtained or a state (for example, a blood flow) of an organ in the living body is measured, on the basis of a received signal.

Configuration of Control Device

The control device 10 corresponds to a controller, and includes, as illustrated in FIG. 1, an operation unit 11 provided with a button or a touch panel, and a display unit 12. Although not illustrated, the control device 10 includes a storage unit formed of a memory or the like, and a calculation unit formed of a central processing unit (CPU) or the like. The control device 10 causes the calculation unit to execute various programs stored in the storage unit, and thus controls the ultrasonic measurement apparatus 1. For example, the control device 10 outputs a command for controlling driving of the ultrasonic probe 2, forms an image of an internal structure of a living body and displays the image on the display unit 12 on the basis of a received signal which is input from the ultrasonic probe 2, or measures biological information such as a blood flow and displays the biological information on the display unit 12. As the control device 10, for example, a terminal device such as a tablet terminal, a smart phone, or a personal computer may be used, and a dedicated terminal device for operating the ultrasonic probe 2 may be used.

Configuration of Ultrasonic Probe

Figure 2:
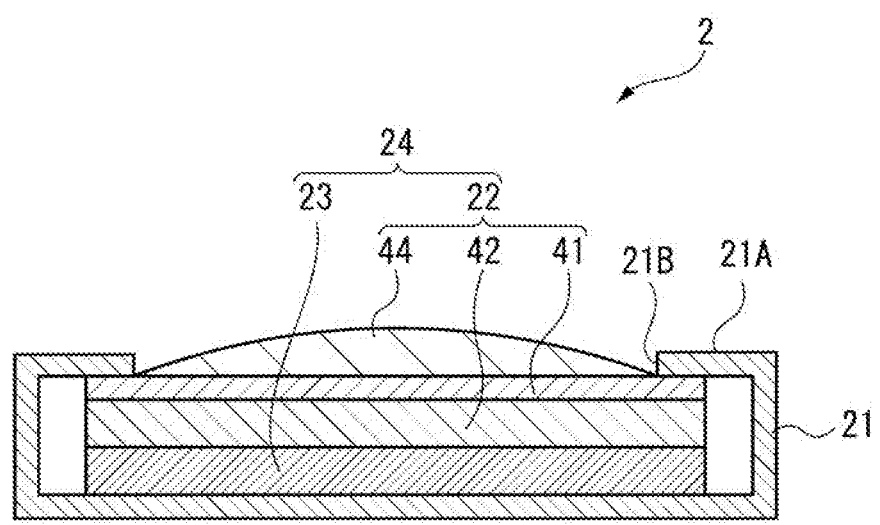
FIG. 2 is a sectional view illustrating a schematic configuration of an ultrasonic probe according to the first embodiment.

FIG. 2 is a sectional view illustrating a schematic configuration of the ultrasonic probe 2.

As illustrated in FIG. 2, the ultrasonic probe 2 includes a casing 21, an ultrasonic device 22 stored in the casing 21, and a circuit substrate 23 provided with a driver circuit and the like for controlling the ultrasonic device 22. An ultrasonic sensor 24 is formed of the ultrasonic device 22 and the circuit substrate 23.

Configuration of Casing

As illustrated in FIG. 1, the casing 21 is formed in a rectangular box shape in a plan view, and is provided with a sensor window 21B on one surface (sensor surface 21A) which is orthogonal to a thickness direction, and a part of the ultrasonic device 22 is exposed to one surface. A passing hole 21C of the cable 3 is provided at a part (a side surface in the example illustrated in FIG. 1) of the casing 21. The cable 3 is inserted into the casing 21 through the passing hole 21C so as to be connected to the circuit substrate 23. A gap between the cable 3 and the passing hole 21C is filled with, for example, a resin material, and thus water resistance is ensured.

In the present embodiment, a configuration example in which the ultrasonic probe 2 is connected to the control device 10 via the cable 3 is described, but this is only an example, and, for example, the ultrasonic probe 2 and the control device 10 may be connected to each other via wireless communication, and various constituent elements of the control device 10 may be provided in the ultrasonic probe 2.

Configuration of Circuit Substrate

The circuit substrate 23 is electrically connected to a signal terminal 413 and a common terminal 415 (refer to FIG. 3) of the ultrasonic device 22 which will be described later, and controls the ultrasonic device 22 under the control of the control device 10.

Specifically, the circuit substrate 23 is provided with a transmission circuit, a reception circuit, and the like. The transmission circuit outputs a drive signal for causing the ultrasonic device 22 to transmit an ultrasonic wave. The reception circuit acquires a received signal output from the ultrasonic device 22 having received an ultrasonic wave, performs an amplification process, an A/D conversion process, an phasing addition process, and the like on the received signal, and outputs the received signal having undergone the processes to the control device 10.

Configuration of Ultrasonic Device

Figure 3:
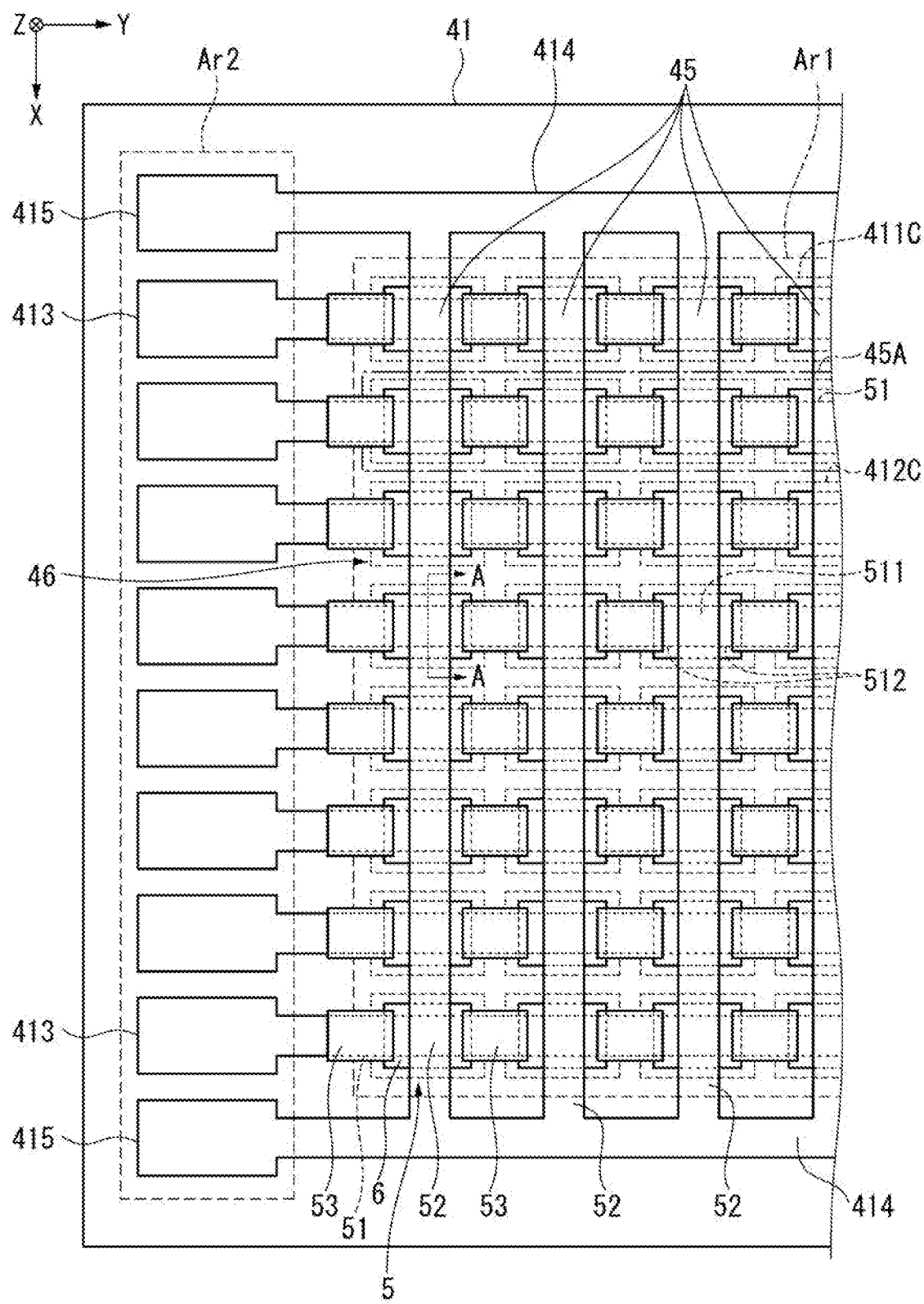
FIG. 3 is a plan view schematically illustrating an element substrate in the ultrasonic device of the first embodiment.
Figure 4:
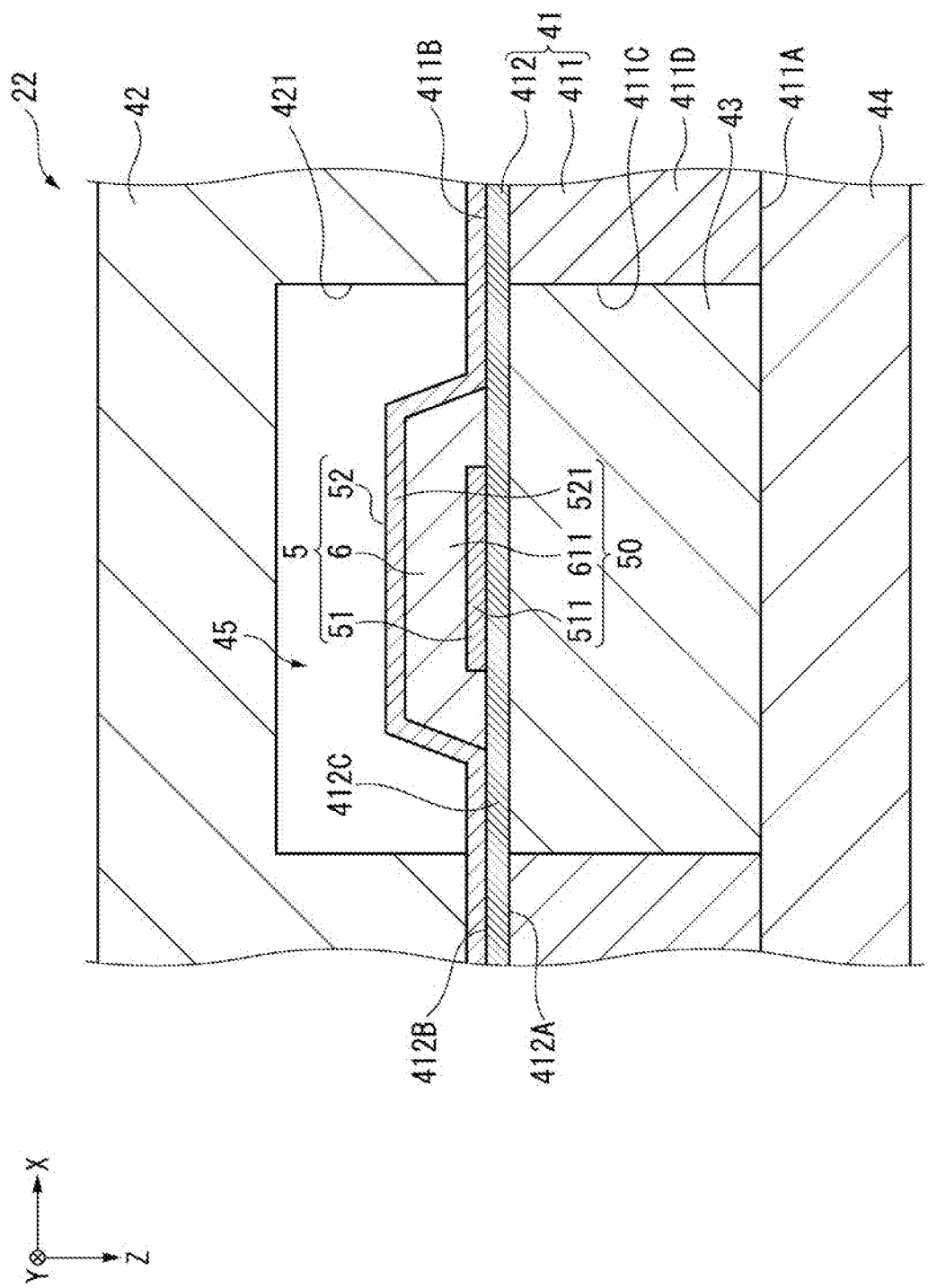
FIG. 4 is a sectional view schematically illustrating the ultrasonic device of the first embodiment.
Figure 5:
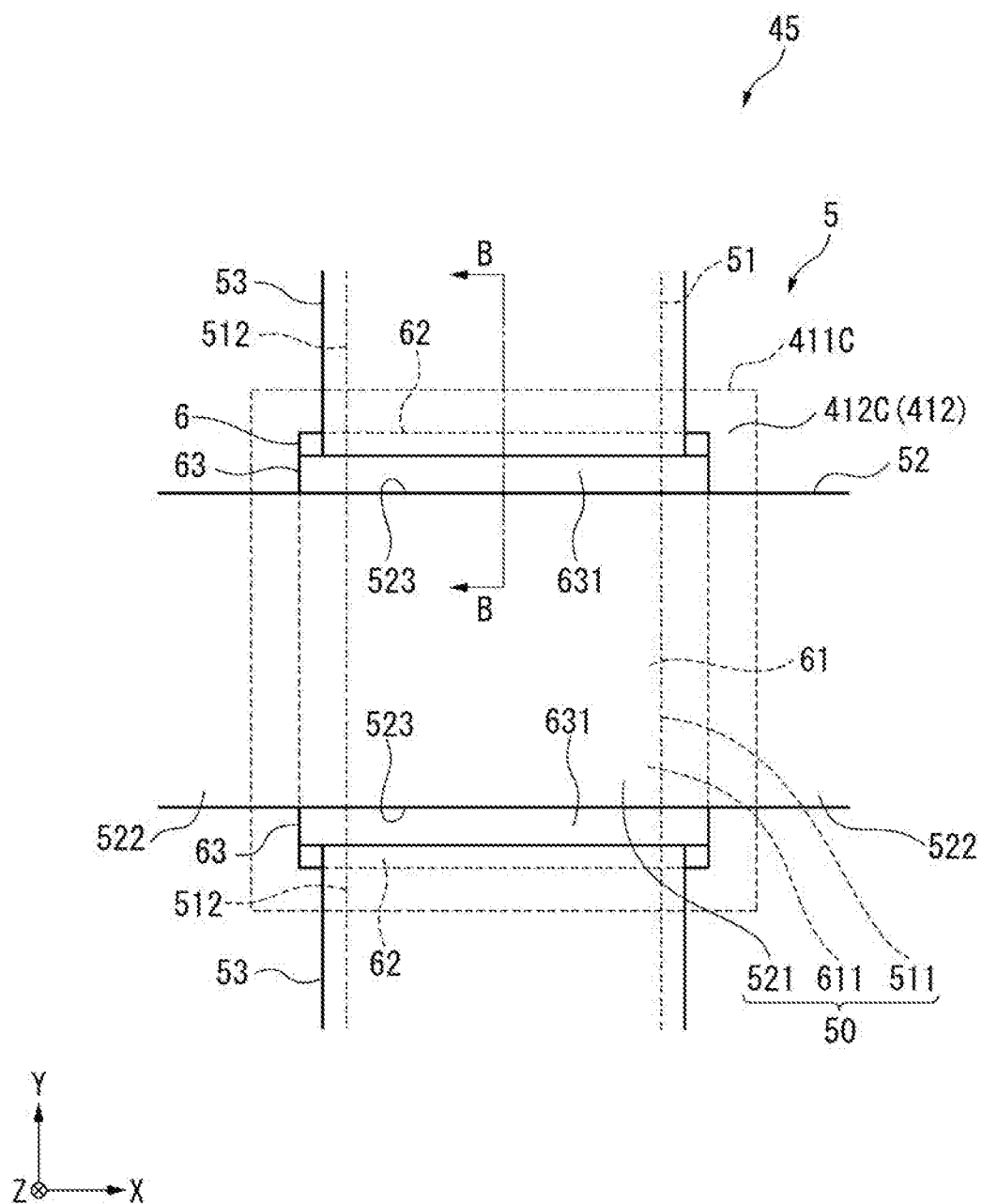
FIG. 5 is a plan view schematically illustrating an ultrasonic transducer of the first embodiment.
Figure 6:
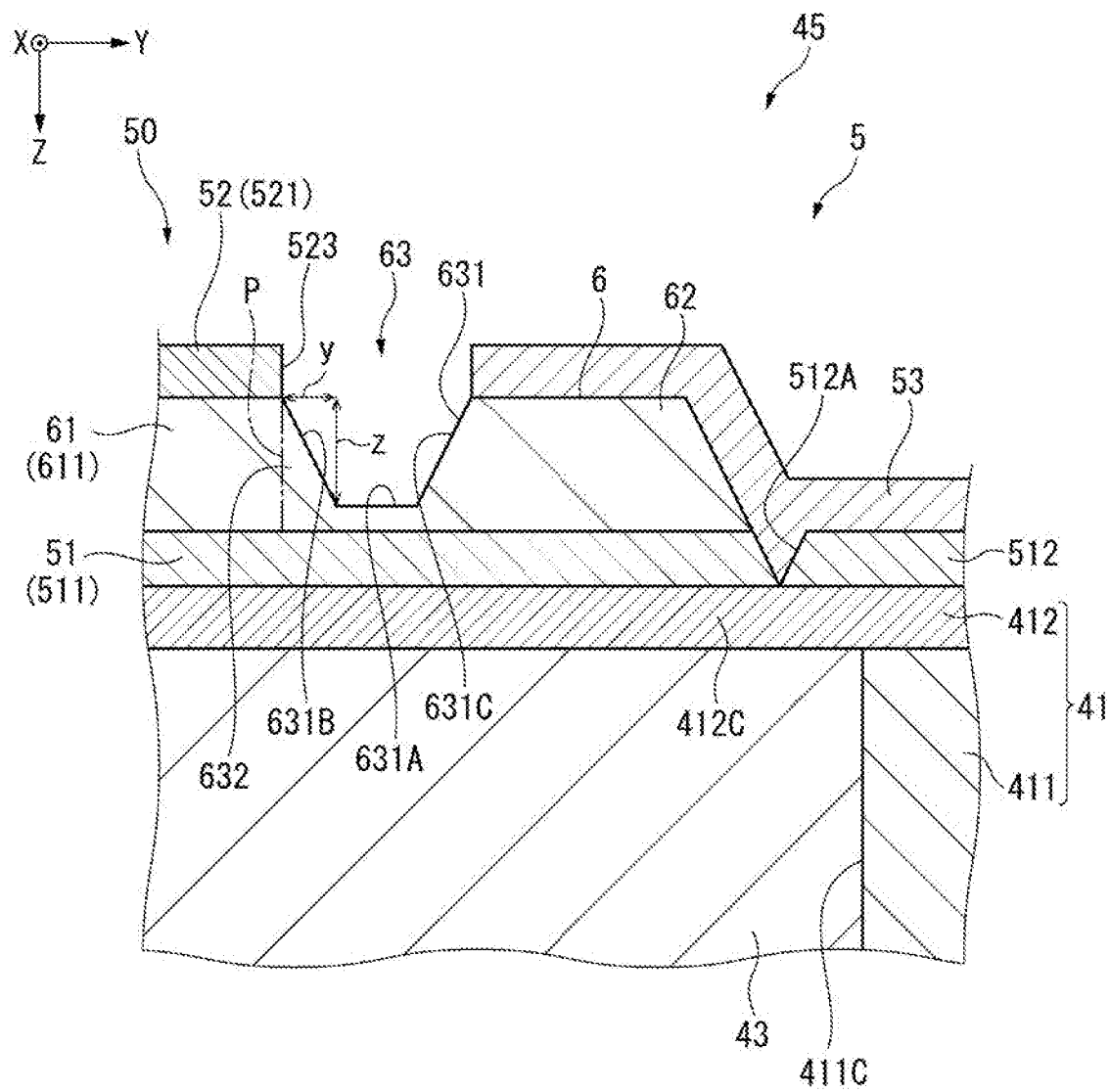
FIG. 6 is a sectional view schematically illustrating the ultrasonic transducer of the first embodiment.

FIG. 3 is a schematic diagram in which an element substrate 41 forming the ultrasonic device 22 is viewed from a sealing plate 42 side. FIG. 4 is a sectional view schematically illustrating a section (ZX section) of the ultrasonic device 22 taken along the line A-A illustrated in FIG. 3. FIG. 5 is a plan view schematically illustrating the ultrasonic transducer 45 provided on the element substrate 41 when viewed from the sealing plate 42 side. FIG. 6 is a sectional view schematically illustrating a section (YZ section) of the ultrasonic transducer 45 taken along the line B-B illustrated in FIG. 5.

As illustrated in FIGS. 2 and 4, the ultrasonic device 22 is configured to include the element substrate 41, the sealing plate 42, an acoustic layer 43 (refer to FIG. 4), and an acoustic lens 44.

Configuration of Element Substrate

As illustrated in FIG. 3, in a plan view (hereinafter, simply referred to as a plan view) in which the element substrate 41 is viewed from a substrate thickness direction (a Z direction), an ultrasonic transducer array 46 including ultrasonic transducers 45 transmitting and receiving ultrasonic waves is provided in a central array region Ar1 of the element substrate 41. The ultrasonic transducer array 46 is formed as a one-dimensional array in which a plurality of ultrasonic transducers 45 are disposed in a matrix form. In other words, the ultrasonic transducer array 46 has a plurality of transmission/reception columns 45A each functioning as a single transmission/reception channel of 1 CH. Each of the plurality of transmission/reception columns 45A is formed of a plurality of ultrasonic transducers 45 disposed along the Y direction (slice direction), and the plurality of transmission/reception columns 45A are disposed in the X direction (scanning direction). In FIG. 3, for convenience of description, the number of disposed ultrasonic transducers 45 is reduced, but, actually, more ultrasonic transducers 45 are disposed.

As illustrated in FIG. 4, the element substrate 41 includes a substrate main body portion 411, and a vibration film 412 provided on the substrate main body portion 411 on the sealing plate 42 side (−Z side). A plurality of piezoelectric elements 5 are provided on the vibration film 412.

Here, in the following description, a surface of the substrate main body portion 411 on the acoustic lens 44 side will be referred to as a front surface 411A, and a surface on the sealing plate 42 side will be referred to as a rear surface 411B. A surface of the vibration film 412 opposite to the sealing plate 42 will be referred to as an ultrasonic wave transmission/reception surface 412A, and a surface thereof on the sealing plate 42 side will be referred to as an operation surface 412B.

The substrate main body portion 411 is a substrate supporting the vibration film 412, and is formed of, for example, a semiconductor substrate such as Si. An opening 411C corresponding to each of the ultrasonic transducers 45 is provided in the substrate main body portion 411.

The vibration film 412 is made of, for example, $SiO_2$ or a laminate of $SiO_2$ and $ZrO_2$, and is provided on the rear surface 411B of the substrate main body portion 411. A thickness dimension of the vibration film 412 is sufficiently smaller than that of the substrate main body portion 411. The vibration film 412 is supported by a wall portion 411D forming the opening 411C, and includes a flexible portion 412C closing the rear surface 411B of the opening 411C. In other words, the opening 411C defines an outer edge of the flexible portion 412C which is a vibration region of the vibration film 412.

The piezoelectric element 5 is provided on the operation surface 412B of the flexible portion 412C. As will be described later in detail, the piezoelectric element 5 is formed as a laminate in which a lower electrode 51, a piezoelectric film 6, and an upper electrode 52 are laminated in this order. A single ultrasonic transducer 45 is formed of the flexible portion 412C of the vibration film 412 and the piezoelectric element 5.

In the ultrasonic transducer 45, a pulse wave voltage having a predetermined frequency is applied between the lower electrode 51 and the upper electrode 52 so that the flexible portion 412C of the vibration film 412 in an open region of the opening 411C vibrates, and thus an ultrasonic wave is transmitted from the ultrasonic wave transmission/reception surface 412A side. If the flexible portion 412C of the vibration film 412 vibrates due to an ultrasonic wave which is reflected from a target object and is incident to the ultrasonic wave transmission/reception surface 412A, a potential difference is generated between upper and lower parts of the piezoelectric film 6. The ultrasonic wave is detected, that is, the ultrasonic wave is received by detecting a potential difference generated between the lower electrode 51 and the upper electrode 52.

Here, as illustrated in FIG. 3, the lower electrode is linearly formed along the Y direction in each transmission/reception column 45A of 1 CH. Both ends (ends on ±Y sides) of the lower electrode 51 are connected to signal terminals 413 in a terminal region Ar2. The signal terminals 413 are electrically connected to the circuit substrate 23. FIG. 3 illustrates only the terminal region Ar2 on the −Y side of the array region Ar1, but the terminal region Ar2 is also provided on the +Y side of the array region Ar1.

The upper electrode 52 is linearly formed along the X direction, and connects the transmission/reception columns 45A arranged in the X direction to each other. Ends of the upper electrode 52 on the ±X sides are connected to common electrode lines 414. The common electrode lines 414 connect a plurality of upper electrodes 52 disposed along the Y direction to each other. Both ends (ends on ±Y sides) of the common electrode line 414 are connected to common terminals 415 in the terminal region Ar2. The common terminal 415 is connected to, for example, a reference potential circuit (not illustrated) of the circuit substrate 23, and is set to a reference potential.

Configuration of Sealing Plate

A planar shape of the sealing plate 42 illustrated in FIGS. 2 and 4, viewed from the thickness direction, is formed to be the same as, for example, that of the element substrate 41, and is formed of a semiconductor substrate such as Si or an insulator substrate. A material or a thickness of the sealing plate 42 influences frequency characteristics of the ultrasonic transducer 45, and is thus preferably set on the basis of a center frequency of an ultrasonic wave which is transmitted and received in the ultrasonic transducer 45.

The sealing plate 42 has a plurality of grooves 421 (refer to FIG. 4) corresponding to the openings 411C in a region facing the array region Ar1 of the element substrate 41. Consequently, a gap with a predetermined dimension is provided between the vibration film 412 and the element substrate 41 in a region (inside the opening 411C) in which the flexible portion 412C of the vibration film 412 is formed, and thus vibration of the vibration film 412 is not hindered. It is possible to prevent the occurrence of a problem (crosstalk) that a back wave from a single ultrasonic transducer 45 is incident to another ultrasonic transducer 45 adjacent thereto.

If the vibration film 412 vibrates, an ultrasonic wave as a back wave is emitted not only to the opening 411C side (ultrasonic wave transmission/reception surface 412A side) but also to the sealing plate 42 side (rear surface 411B side). The back wave is reflected by the sealing plate 42, and is emitted to the vibration film 412 side again via the gap. In this case, if phases of the reflected back wave and the ultrasonic wave emitted to the ultrasonic wave transmission/reception surface 412A from the vibration film 412 are deviated relative to each other, the ultrasonic wave attenuates. Therefore, in the present embodiment, a depth of each of the grooves 421 is set so that an acoustic distance in the gap between the element substrate 41 and the sealing plate 42 is an odd-numbered multiple of $\lambda/4$ when a wavelength of the ultrasonic wave is indicated by $\lambda$. In other words, a thickness dimension of each portion of the element substrate 41 or the sealing plate 42 is set by taking into consideration the wavelength $\lambda$ of an ultrasonic wave emitted from the ultrasonic transducer 45.

The sealing plate 42 is provided with a connection portion which connects each of the terminals 413 and 415 to the circuit substrate 23 at a position facing the terminal region Ar2 of the element substrate 41. The connection portion may have an exemplary configuration including, for example, openings provided in the element substrate 41, and a wiring member such as a flexible printed circuits (FPC), cables, or wires connecting the respective terminals 413 and 415 to the circuit substrate 23 via the openings.

Configurations of Acoustic Layer and Acoustic Lens

As illustrated in FIG. 4, the acoustic layer 43 is provided on the ultrasonic wave transmission/reception surface 412A side. In other words, the acoustic layer 43 fills the opening 411C.

The acoustic lens 44 is disposed on the front surface 411A side of the element substrate 41, that is, the +Z side of the element substrate 41 and the acoustic layer 43. The acoustic lens 44 is brought into close contact with a living body surface, and causes an ultrasonic wave transmitted from the ultrasonic transducer 45 to converge in the living body. The acoustic lens 44 causes an ultrasonic wave reflected inside the living body to propagate toward the ultrasonic transducer 45 via the acoustic layer 43.

Each of the acoustic layer 43 and the acoustic lens 44 is set to acoustic impedance similar to acoustic impedance of the living body. Consequently, the acoustic layer 43 and the acoustic lens 44 cause an ultrasonic wave transmitted from the ultrasonic transducer 45 to propagate toward a living body with high efficiency, and cause an ultrasonic wave reflected inside the living body to propagate toward the ultrasonic transducer 45 with high efficiency.

Configuration of Piezoelectric Element

As illustrated in FIGS. 5 and 6, the piezoelectric element 5 includes the lower electrode 51, the piezoelectric film 6, the upper electrode 52, and a conductive layer 53 laminated in this order.

The piezoelectric element 5 has an active section 50 which is deformed when a voltage is applied between the lower electrode 51 and the upper electrode 52. The active section 50 is located on the flexible portion 412C corresponding to a drive portion, and is formed by laminating a lower electrode main body portion 511, a piezoelectric film main body portion 611, and an upper electrode main body portion 521 in the Z direction (laminate direction).

The lower electrode 51 corresponds to a first electrode layer, and includes the lower electrode main body portion 511 and a lower electrode connection portion 512.

The lower electrode main body portion 511 overlaps the piezoelectric film 6 and the upper electrode 52 in a plan view, and is provided on the flexible portion 412C of the vibration film 412. In other words, the lower electrode main body portion 511 is provided at each of a plurality of piezoelectric elements 5.

As illustrated in FIG. 5, the lower electrode connection portion 512 extends from each of the ±Y sides of the lower electrode main body portion 511 along the Y direction. The lower electrode connection portion 512 connects the adjacent lower electrode main body portions 511 to each other among a plurality of lower electrode main body portions 511 included in the transmission/reception column 45A illustrated in FIG. 3.

The upper electrode 52 corresponds to a second electrode layer, and is a common electrode to the respective ultrasonic transducers 45 (piezoelectric elements 5) (refer to FIG. 3). As a material of the upper electrode 52, for example, metal materials such as Pt, Ir, Ti, Zr, Au, Ni, NiCr, TiW, Al, and Cu may be used.

As illustrated in FIG. 5, at least a part of the upper electrode 52 is provided on the piezoelectric film 6, and the upper electrode 52 has an upper electrode main body portion 521 and an upper electrode connection portion 522.

The upper electrode main body portion 521 overlaps the lower electrode 51 and the piezoelectric film 6 in a plan view. In other words, the upper electrode main body portion 521 is provided at each of the piezoelectric elements 5.

The upper electrode connection portion 522 extends from each of the ±X sides of the upper electrode main body portion 521 along the X direction, and connects the upper electrode main body portions 521 which are adjacent to each other in the X direction, to each other. The upper electrode connection portion 522 connects the lower electrode main body portions 511 of the piezoelectric elements 5 on the ±X sides among a plurality of piezoelectric elements 5 provided in the X direction, to the common electrode lines 414.

The conductive layer 53 is located from the lower electrode connection portion 512 of the lower electrode 51 to the piezoelectric film 6, and is made of a metal material. As a material of the conductive layer 53 in the same manner as the upper electrode 52, for example, metal materials such as Pt, Ir, Ti, Zr, Au, Ni, NiCr, TiW, Al, and Cu may be used.

However, there is a case where a depression 512A as illustrated in FIG. 6 is formed at a position along an outer edge of the piezoelectric film 6 in the lower electrode connection portion 512 of the lower electrode 51 in a plan view since the piezoelectric film 6 is overetched when the piezoelectric film 6 is patterned through dry etching or the like. If the depression 512A is formed, electrical resistance in the depression 512A increases, drive characteristics of the ultrasonic transducer 49 deteriorates, the lower electrode main body portion 511 and the lower electrode connection portion 512 are disconnected from each other depending on cases, and thus the ultrasonic transducer 49 is not driven.

In contrast, in the present embodiment, even in a case where the depression 512A is formed, the conductive layer 53 is provided to cover the depression 512A at a position overlapping at least the depression 512A of the lower electrode connection portion 512 as illustrated in FIG. 6. Consequently, an increase in electrical resistance or disconnection in the depression 512A is suppressed. An end of the conductive layer 53 in the Y direction is provided on the piezoelectric film 6 so as to be separated from the upper electrode 52 in the Y direction, and is not electrically connected to the upper electrode 52.

The piezoelectric film 6 corresponds to a piezoelectric body layer, and is formed by using, for example, a transition metal oxide having a perovskite structure, specifically, lead zirconate titanate containing Pb, Ti, and Zr.

The piezoelectric film 6 has a substantially rectangular outer shape in a plan view, and is provided to cover a part of the lower electrode 51 at a position overlapping the flexible portion 412C. The piezoelectric film 6 includes a first coated portion 61 including the piezoelectric film main body portion 611, a second coated portion 62, and a non-coated portion 63.

As illustrated in FIG. 5, the first coated portion 61 is a portion (first portion) covered with the upper electrode 52 provided to straddle the piezoelectric film 6 along the X direction in the piezoelectric film 6, and overlaps the upper electrode 52 in a plan view. In the first coated portion 61, a portion overlapping the lower electrode main body portion 511 and the upper electrode main body portion 521 in a plan view is the piezoelectric film main body portion 611. As described above, the active section 50 is formed as a laminate of the lower electrode main body portion 511, the piezoelectric film main body portion 611, and the upper electrode main body portion 521.

As illustrated in FIG. 5, the second coated portion 62 is a portion (second portion) covered with the conductive layer 53 in a portion not covered with the upper electrode 52 in the piezoelectric film 6, and overlaps the conductive layer 53 in a plan view. Here, a region not overlapping the upper electrode 52 is formed in the piezoelectric film 6 on each of the ±Y sides of the first coated portion 61. Of the regions not overlapping the upper electrode 52 in the piezoelectric film 6, the region in which the conductive layer 53 is provided is the second coated portion 62. The second coated portion 62 is located to be separated from the first coated portion 61 via the non-coated portion 63 in the Y direction. A thickness of the second coated portion 62 is substantially the same as a thickness of the first coated portion 61.

As illustrated in FIGS. 5 and 6, the non-coated portion 63 is a portion (third portion) which is not covered with the upper electrode 52 and the conductive layer 53 in the piezoelectric film 6, that is, which does not overlap the upper electrode 52 and the conductive layer 53 in a plan view. The non-coated portion 63 has a groove 631, and a thickness of at least a part thereof is smaller than a thickness of the first coated portion 61.

The groove 631 is formed along an end 523 of the upper electrode 52 on each of the ±Y sides in a plan view. In other words, as illustrated in FIG. 6, the groove 631 is provided at a position including a boundary P (an edge of the upper electrode main body portion 521 on each of the ±Y sides) with the first coated portion 61 in the non-coated portion 63. As illustrated in FIG. 5, the groove 631 is provided from a boundary between the first coated portion 61 and the non-coated portion 63 to a boundary between the second coated portion 62 and the non-coated portion 63 in the Y direction, and is located between the first coated portion 61 and the second coated portion 62. A dimension of the groove 631 in the Y direction is, for example, about 5 μm. In other words, the upper electrode main body portion 521 and the conductive layer 53 are disposed to be separated from each other by about 5 μm in the Y direction.

The groove 631 has, as illustrated in FIG. 6, a groove bottom 631A which is substantially parallel to the XY plane, a first groove side surface 631B between the groove bottom 631A and the first coated portion 61, and a second groove side surface 631C between the groove bottom 631A and the second coated portion 62.

The first groove side surface 631B is connected to the first coated portion 61 (boundary P) and the groove bottom 631A, and is inclined toward the element substrate 41 side (+Z side) as a distance thereof from the first coated portion 61 increases.

A gradually reduced portion 632 is formed by a region in which the first groove side surface 631B is formed. The gradually reduced portion 632 is a sidewall portion including the first groove side surface 631B of the groove 631, and has a gradually decreasing thickness from the boundary P toward an opposite side to the first coated portion 61 in a plan view.

The second groove side surface 631C is connected to the groove bottom 631A and the second coated portion 62, and is inclined toward the element substrate 41 side (+Z side) as a distance thereof from the second coated portion 62 increases.

A ratio between a dimension y of the gradually reduced portion 632 in the Y direction and a dimension z thereof in the Z direction is, for example, 1:2. In this case, a dimension of the first groove side surface 631B in a section which is parallel to the YZ plane is about 2.2y.

In the present embodiment, a dimension of the second groove side surface 631C in the Y direction is the same as that of the first groove side surface 631B. In other words, a distance between the upper electrode 52 and the conductive layer 53 along the inner surface of the groove 631 is increased by about 2.2 y compared with a case where the groove 631 is not provided.

In the piezoelectric film 6 configured as described above, a thickness of the first coated portion 61 is the maximum thickness of the piezoelectric film 6, and is preferably, for example, 1000 nm to 2000 nm, and is 1300 nm in the present embodiment.

A thickness in the region in which the groove bottom 631A of the groove 631 is formed is smaller than the maximum thickness of the piezoelectric film 6, and is, for example, 100 nm or more and 500 nm or less. In a case where a thickness of the piezoelectric film 6 is 100 nm or more, it is possible to suppress the occurrence of a crack in the non-coated portion 63 due to deformation of the piezoelectric film 6 when the ultrasonic transducer 45 is driven. In a case where a thickness of the piezoelectric film 6 is 500 nm or less, the groove 631 can be easily deformed when the ultrasonic transducer 45 is driven.

Advantageous Effects of First Embodiment

The following effects can be achieved in the first embodiment configured as described above.

In the present embodiment, since the upper electrode is laminated on the first coated portion 61 of the piezoelectric film 6, and the conductive layer 53 is laminated on the second coated portion 62, it is possible to suppress the occurrence of a crack in the first coated portion 61 and the second coated portion 62. A thickness of at least a part of the non-coated portion 63 is smaller than a thickness of the first coated portion 61 including the active section 50. In this configuration, even in a case where the active section 50 is deformed due to voltage application, a part of the non-coated portion 63 whose thickness is reduced is deformed, and thus it is possible to suppress the occurrence of a crack in the non-coated portion 63 including the boundary P between the active section 50 and the inactive section.

As mentioned above, according to the piezoelectric element 5 of the present embodiment, it is possible to suppress the occurrence of a crack in the piezoelectric film 6, further to suppress the occurrence of burning, and thus to suppress deterioration in the performance of the piezoelectric element 5.

In the present embodiment, the upper electrode 52 and the conductive layer 53 are formed of metal layers. Thus, it is possible to more reliably alleviate the stress applied to the first coated portion 61 and the second coated portion 62 of the piezoelectric film 6 due to the elastic force of the metal layers.

A thickness of the non-coated portion 63 is smaller than a thickness of the first coated portion 61 at the position including at least the boundary P in a plan view.

In other words, a thickness of the non-coated portion 63 is smaller than a thickness of the first coated portion 61 at the position along at least the end 523 of the upper electrode 52 in a plan view. Consequently, the position near the boundary P in the non-coated portion 63 of the piezoelectric film 6 can be more reliably and easily deformed. Therefore, at the boundary P, it is possible to more reliably suppress the occurrence of a crack in the piezoelectric film 6, and also to more reliably suppress burning of the piezoelectric film 6.

The non-coated portion 63 has the gradually reduced portion 632 whose thickness is gradually reduced from the boundary P toward an opposite side to the first coated portion 61 in a plan view. In this configuration, it is possible to prevent the stress from concentrating on the boundary P compared with a case where a corner portion on which the stress easily concentrates is formed by forming, for example, a step difference at the boundary P or in the vicinity thereof in order to reduce a thickness of the non-coated portion 63. Therefore, it is possible to suppress the occurrence of a crack in the boundary P of the piezoelectric film 6, and also to more reliably suppress burning of the piezoelectric film 6.

The non-coated portion 63 has the groove 631 located between the first coated portion 61 and the second coated portion 62. Consequently, compared with a case where the groove 631 is not provided, it is possible to increase a distance between the upper electrode 52 and the conductive layer 53 along the surface of the non-coated portion 63 on the −Z side (the inner surface of the groove 631). In other words, compared with a case where the groove 631 is not provided, it is possible to increase a substantial distance between the upper electrode 52 and the conductive layer 53 by forming the first groove side surface 631B and the second groove side surface 631C. Therefore, even in a case where water is attached to the surface of the non-coated portion 63 on the −Z side, it is possible to more reliably insulate the upper electrode 52 from the conductive layer 53.

As described above, the groove 631 is formed as described above, and thus it is possible to suppress the occurrence of a crack or burning in the piezoelectric film 6, and electrical connection between the upper electrode 52 and the conductive layer 53, so that a protection film covering the non-coated portion 63 is not required to be separately provided. Therefore, driving of the piezoelectric element 5 is not hindered due to provision of the protection film, and deterioration in an output level of the ultrasonic transducer 45 can be suppressed. A configuration can be simplified compared with a case where the protection film is provided, and thus it is possible to simplify manufacturing processes or to reduce manufacturing cost.

Second Embodiment

Hereinafter, a second embodiment will be described.

In the ultrasonic transducer of the first embodiment, the groove 631 has the substantially planar groove bottom 631A, and the substantially planar first groove side surface 631B and second groove side surface 631C connected to the groove bottom 631A. In contrast, the second embodiment is different from the first embodiment in that the groove 631 has a curved groove inner surface.

In the following description, the same constituent elements as those in the first embodiment are given the same reference numerals, and description thereof will be omitted or will be made briefly.

Figure 7:
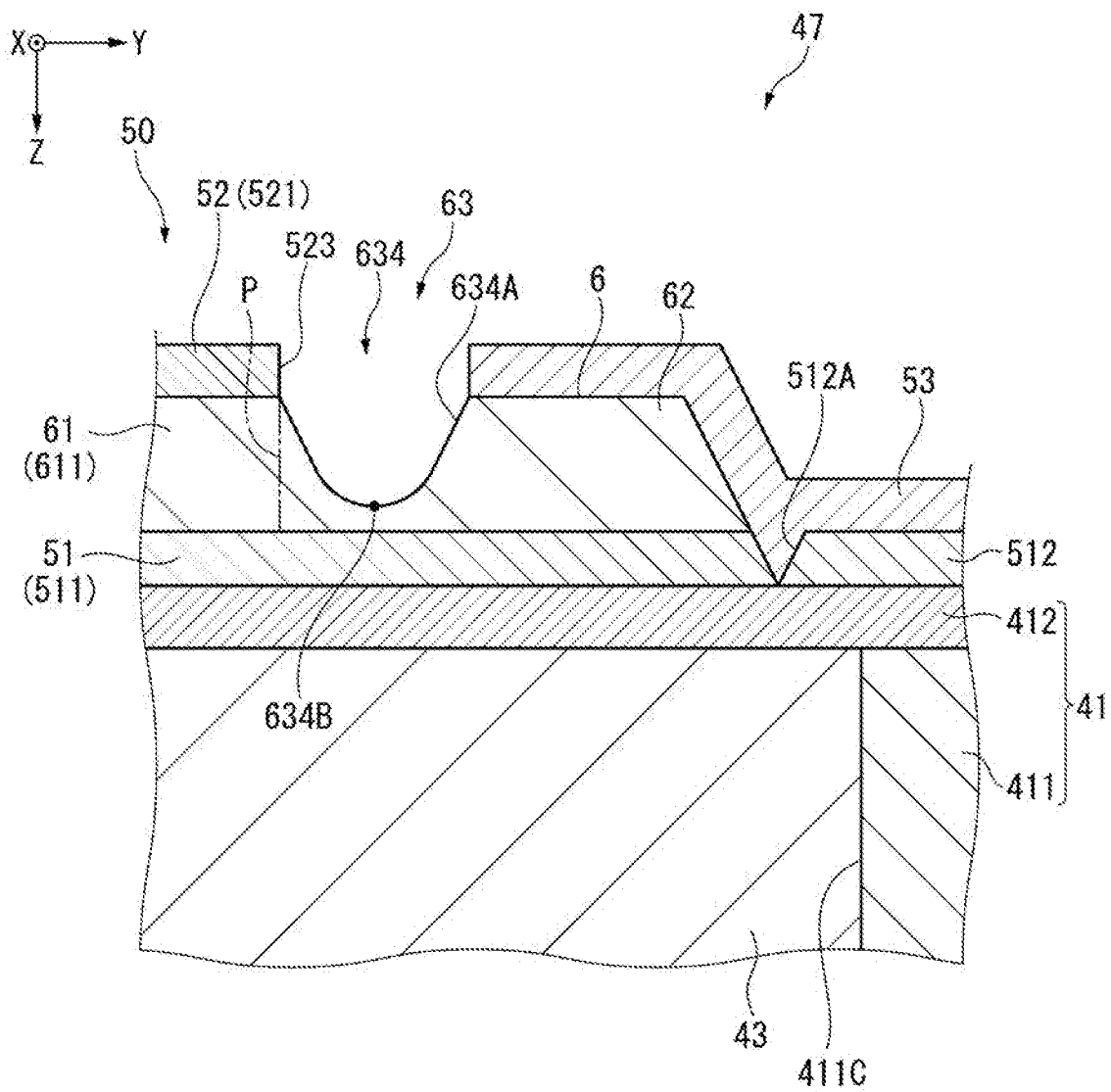
FIG. 7 is a sectional view schematically illustrating an ultrasonic transducer of a second embodiment.

FIG. 7 is a sectional view schematically illustrating a section of a face which is parallel to the YZ plane in an ultrasonic transducer 47 according to the second embodiment.

As illustrated in FIG. 7, in the ultrasonic transducer 47, a groove 634 is formed in the non-coated portion 63 of the piezoelectric film 6.

The groove 634 is formed substantially in the same manner as the groove 631 of the first embodiment except that a curved groove inner surface 634A is provided. In other words, the groove 634 is formed along an end 523 of the upper electrode 52 on each of the ±Y sides. The groove 634 is formed from the first coated portion 61 to the second coated portion 62 in a region overlapping the first coated portion 61 and the second coated portion 62 in the Y direction of the non-coated portion 63. The groove inner surface 634A is curved in a depressed shape toward the +Z side such that a depth dimension of the groove 634 increases toward the center thereof in the Y direction.

A thickness of the non-coated portion 63 in which the above-described groove 634 is formed is gradually reduced from the first coated portion 61 (boundary P) toward the deepest part 634B of the groove 634. In other words, in the non-coated portion 63, the region from the boundary P to the deepest part 634B in the Y direction corresponds to a gradually reduced portion.

Advantageous Effects of Second Embodiment

In the second embodiment, the following advantageous effects can be achieved in addition to the same advantageous effects as those in the first embodiment.

In the second embodiment, the groove inner surface 634A of the groove 634 is a curved surface. Specifically, the groove inner surface 634A is curved in a depressed shape toward the +Z side such that a depth dimension of the groove 634 increases toward the center thereof in the Y direction. In this configuration, compared with a case where a corner portion in which the stress easily concentrates on the groove inner surface 634A is formed, it is possible to prevent the stress from concentrating on the non-coated portion 63. Therefore, it is possible to suppress the occurrence of a crack in the piezoelectric film 6 and also to more reliably suppress burning of the piezoelectric film 6.

Third Embodiment

Hereinafter, a third embodiment will be described.

In the ultrasonic transducer of the first embodiment, the first coated portion 61 and the second coated portion 62 are located with the groove 631 interposed therebetween, and a thickness of the second coated portion 62 is substantially the same as a thickness of the first coated portion 61. In contrast, the third embodiment is different from the first embodiment in that a thickness of the second coated portion 62 is smaller than a thickness of the first coated portion 61.

In the following description, the same constituent elements as those in the first embodiment are given the same reference numerals, and description thereof will be omitted or will be made briefly.

Figure 8:
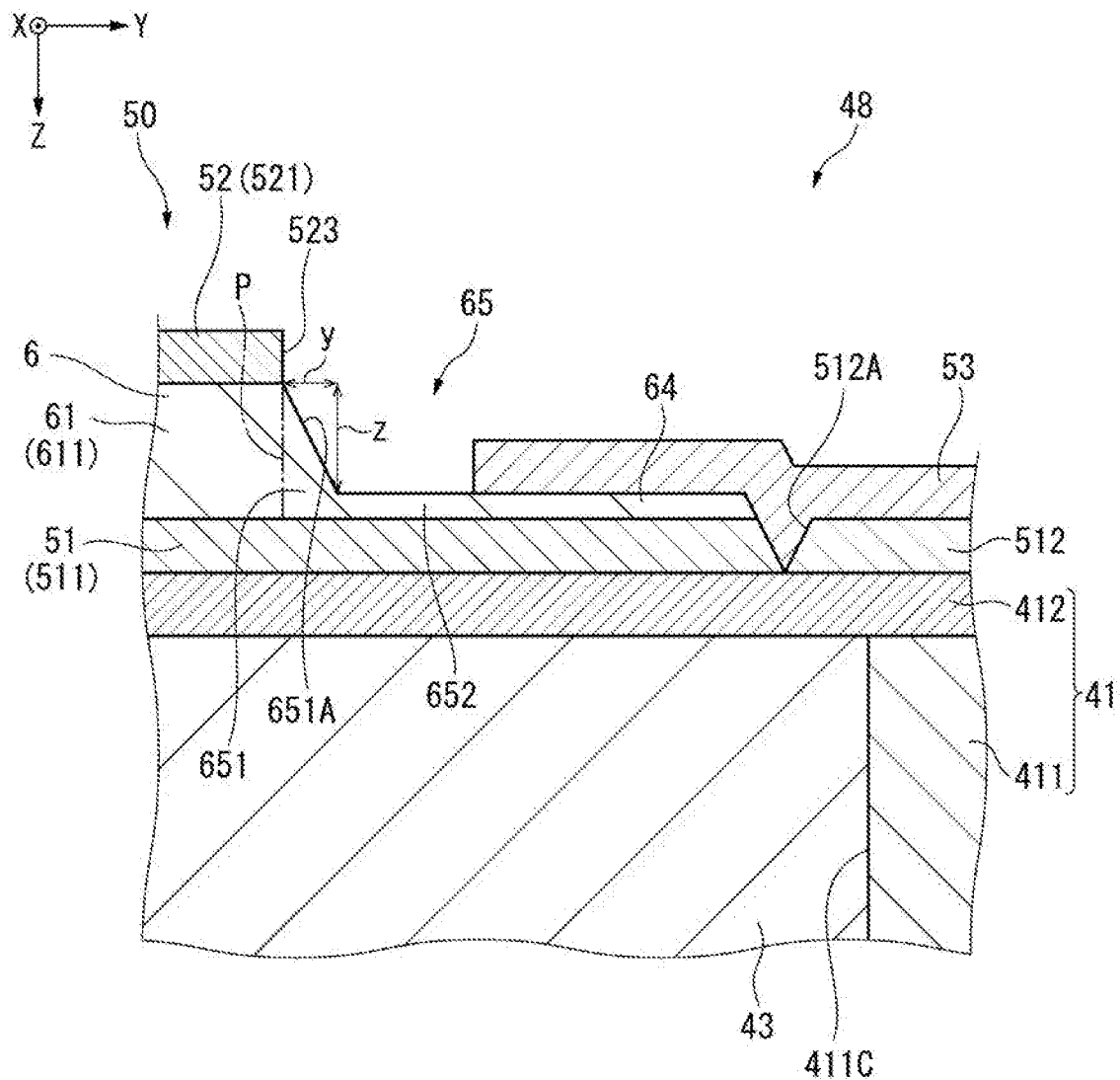
FIG. 8 is a sectional view schematically illustrating an ultrasonic transducer of a third embodiment.

FIG. 8 is a sectional view schematically illustrating a section of a face which is parallel to the YZ plane in an ultrasonic transducer 48 according to the third embodiment.

As illustrated in FIG. 8, the piezoelectric film 6 of an ultrasonic transducer 48 includes a first coated portion 61, a second coated portion 64 having a thickness smaller than that of the first coated portion 61, and a non-coated portion 65.

The non-coated portion 65 is a region not overlapping the upper electrode 52 and the conductive layer 53 in a plan view in the piezoelectric film 6, and has a gradually reduced part 651 and a thin part 652.

In a plan view, the gradually reduced part 651 is formed along the end 523 on each of the ±Y sides of the upper electrode 52, and a thickness thereof is gradually reduced from the boundary P with the first coated portion 61 toward an opposite side to the first coated portion 61. In other words, a surface 651A of the gradually reduced part 651 on the −Z side is inclined toward the element substrate 41 side (+Z side) as a distance thereof from the boundary P increases in the Y direction (hereinafter, also referred to as an inclined surface 651A).

Also in the present embodiment, a ratio between a dimension y of the gradually reduced part 651 in the Y direction and a dimension z thereof in the Z direction is, for example, 1:2, and a dimension of the inclined surface 651A is about 2.2y.

The thin part 652 is located on an opposite side to the first coated portion 61 in the Y direction with respect to the gradually reduced part 651 in a plan view, and is provided to be connected to the gradually reduced part 651. A thickness of the thin part 652 is smaller than a thickness of at least the first coated portion 61, and is, for example, 100 nm or more and 500 nm or less. In a case where a thickness of the thin part 652 is 100 nm or more, it is possible to suppress the occurrence of a crack in the non-coated portion 65 due to deformation of the piezoelectric film 6 when the ultrasonic transducer 45 is driven. In a case where a thickness of the piezoelectric film 6 is 500 nm or less, the non-coated portion 65 can be easily deformed when the ultrasonic transducer 48 is driven.

The second coated portion 64 is configured substantially in the same manner as the second coated portion 62 of the first embodiment except that a thickness thereof is smaller than that of the first coated portion 61, and is covered with the conductive layer 53. A thickness of the second coated portion 64 is the same as a thickness of the thin part 652. In other words, the thin part 652 and the surface of the second coated portion 64 on the −Z side are coplanar with each other.

Advantageous Effects of Third Embodiment

In the third embodiment, the following advantageous effects can be achieved in addition to the same advantageous effects as those in the first embodiment.

A thickness of at least a part of the second coated portion 62 is smaller than a thickness of the first coated portion 61. In this configuration, the second coated portion 62 can also be easily deformed along with the non-coated portion 65. Thus, it is possible to more reliably suppress the occurrence of a crack due to concentration of the stress on the non-coated portion 65 when the piezoelectric element 5 is driven.

Since the second coated portion 62 and the non-coated portion 65 which are parts of the inactive section can be easily deformed, an output level of the ultrasonic transducer 48 can be improved.

Since the gradually reduced part 651 is formed, it is possible to increase a distance between the upper electrode and the conductive layer 53 along the surface of the non-coated portion 65 on the −Z side. Therefore, even in a case where water is attached to the surface of the non-coated portion 65 on the −Z side, it is possible to more reliably insulate the upper electrode 52 from the conductive layer 53.

MODIFICATION EXAMPLES

The invention is not limited to the above-described embodiments, and includes configurations obtained through modifications and alterations within the scope in which the object of the invention can be achieved, and combinations of the respective embodiments.

Figure 9:
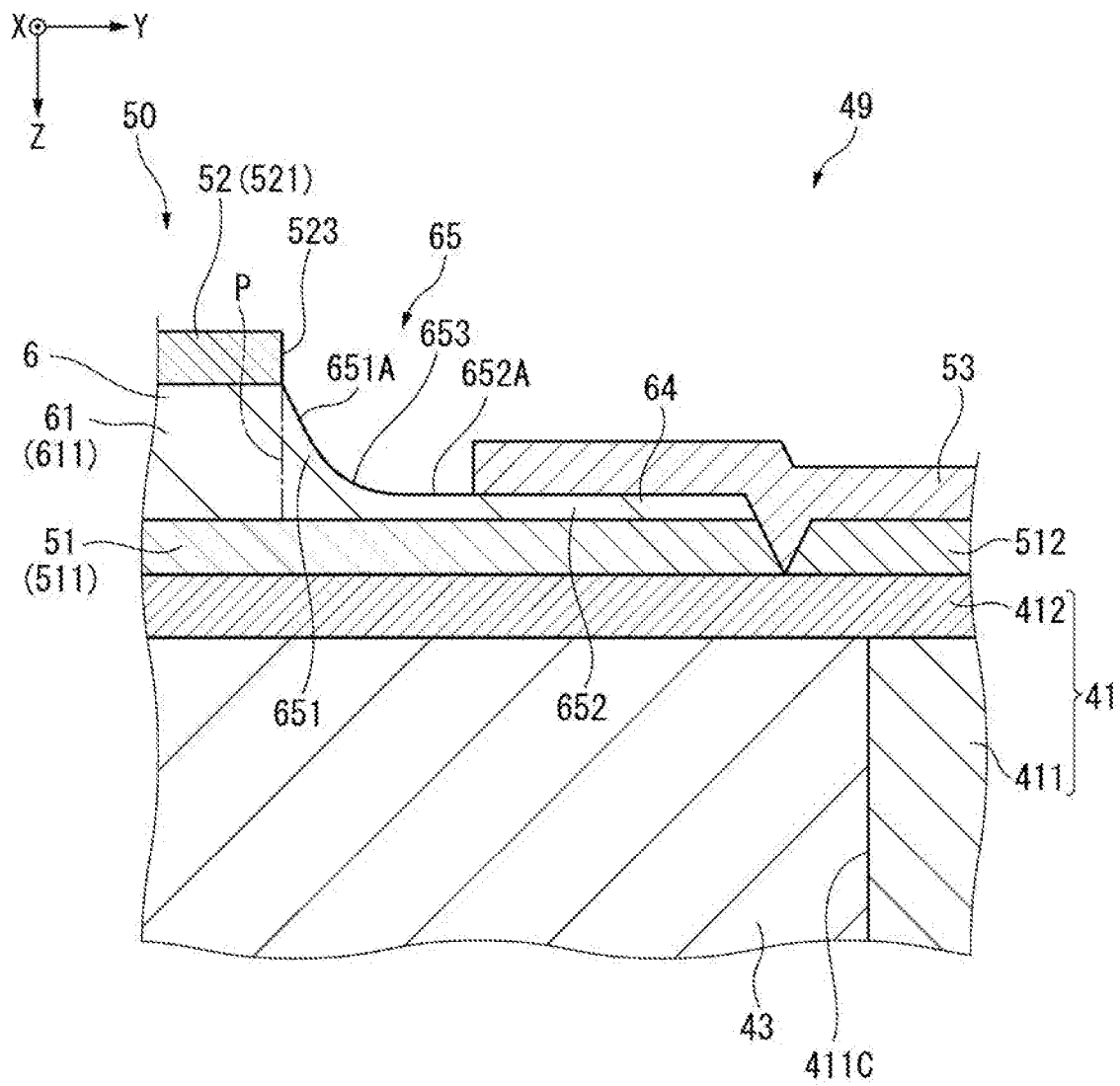
FIG. 9 is a sectional view schematically illustrating an ultrasonic transducer related to a modification example of the third embodiment.

FIG. 9 is a sectional view schematically illustrating an ultrasonic transducer 49 related to a modification example. FIG. 9 illustrates a section of the ultrasonic transducer 49 which is parallel to the YZ plane.

In the ultrasonic transducer 49 of the modification example illustrated in FIG. 9, there is a difference from the third embodiment in that the inclined surface 651A of the gradually reduced part 651 is connected to the surface (also referred to as an upper surface) 652A of the thin part 652 on the −Z side via a curved surface 653. The curved surface 653 is curved toward the +Z side in a depressed shape. In this configuration, it is possible to prevent the stress from concentrating on a boundary between the inclined surface 651A and the upper surface 652A, and thus to more reliably suppress the occurrence of a crack in the non-coated portion 65.

In the third embodiment and the modification example, the gradually reduced part 651 and the thin part 652 are formed in the non-coated portion 65, but are not limited thereto, and the thin part 652 may not be formed. In other words, the gradually reduced part 651 may be formed from the first coated portion 61 to the second coated portion 64.

In the third embodiment and the modification example, the gradually reduced part 651 is formed in only the non-coated portion 65, but may be formed over at least a part between the non-coated portion 65 and the second coated portion 64. For example, a thickness of the piezoelectric film 6 may be reduced as a distance thereof from the first coated portion 61 increases in a plan view.

In the respective embodiments, a description has been made of an exemplary configuration in which a thickness of the gradually reduced part is consecutively reduced as a distance thereof from the first coated portion 61 increases in a plan view, but this is only an example, and a thickness of the gradually reduced part may be reduced stepwise.

Figure 10:
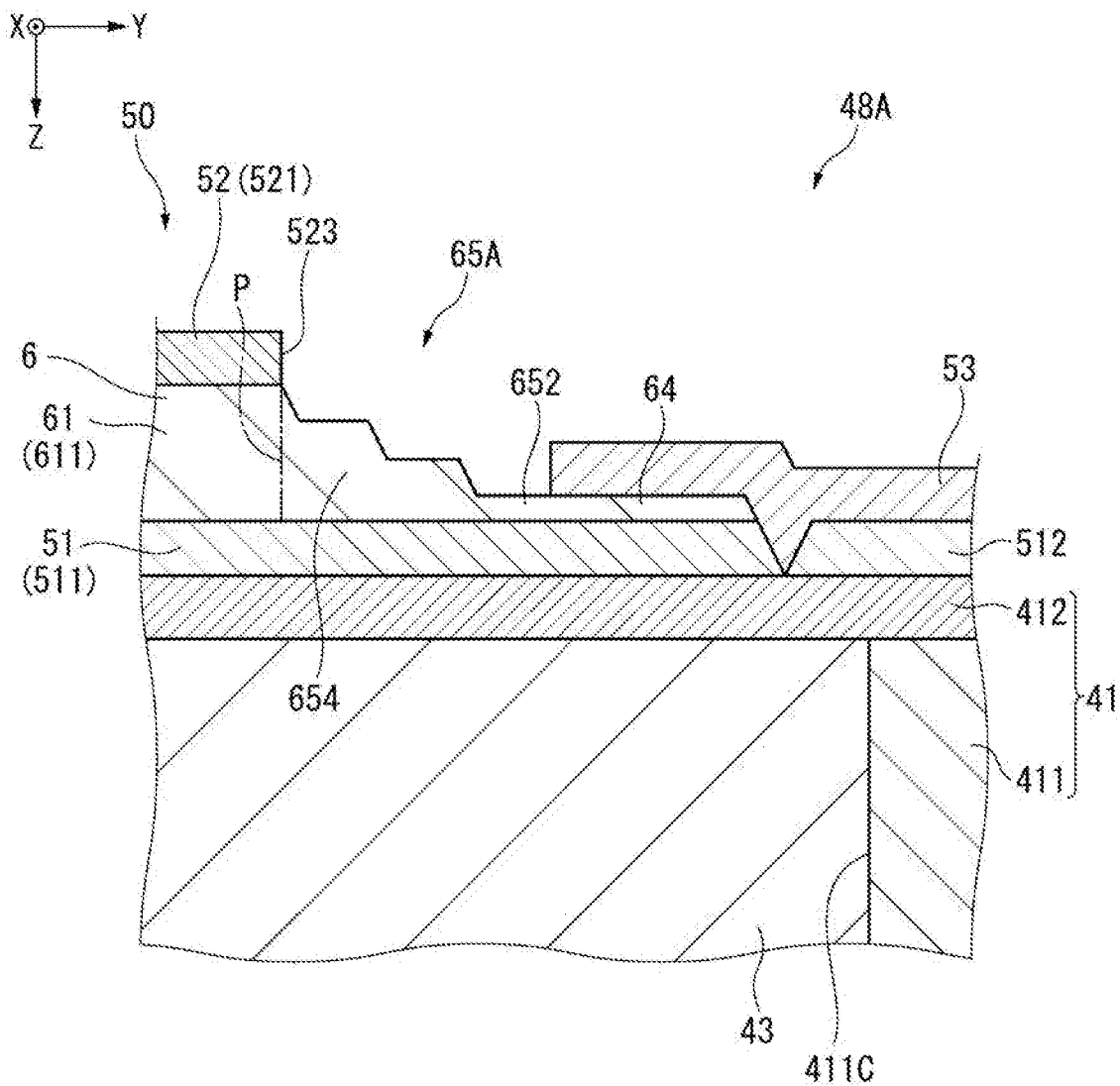
FIG. 10 is a sectional view schematically illustrating an ultrasonic transducer related to another modification example.

FIG. 10 is a sectional view schematically illustrating an ultrasonic transducer 48A related to a modification example of the third embodiment.

In the ultrasonic transducer 48A illustrated in FIG. 10, a thickness of a non-coated portion 65A is reduced stepwise as a distance thereof from the first coated portion 61 increases in a plan view. In other words, a gradually reduced part 654 of the non-coated portion 65A has a plurality of step parts, and a thickness of each step part is reduced toward the second coated portion 64 side from the first coated portion 61 side. In this configuration, of a plurality of step parts, the rigidity of the step part on the first coated portion 61 (boundary P) side can be increased more than on the second coated portion 64 side, and thus it is possible to suppress the occurrence of a crack around the boundary P. Since the rigidity on the second coated portion 64 side is reduced, even if a crack occurs, a position where the crack occurs can be separated from the boundary P, and also to more reliably suppress the occurrence of burning.

In the configuration in which a plurality of step parts as illustrated in FIG. 10 are provided, a boundary between an upper surface (a surface on the −Z side) of each step part and a side surface connected to each upper surface may be continued as a curved surface. Consequently, it is possible to prevent the stress from concentrating on the boundary between the upper surface and the side surface of each step part, and thus to suppress the occurrence of a crack in the boundary.

A corner portion may be formed at a boundary between the side surface of the step part of the gradually reduced part 654 and the upper surface of the thin part 652, so that a crack easily occurs in the boundary. Consequently, a position where a crack occurs can be separated from the boundary P, and thus to more reliably suppress the occurrence of burning.

In the first and second embodiments, a description has been made of an exemplary configuration in which a single groove 631 or 634 is formed in the non-coated portion 63, but this is only an example, and a plurality of grooves may be formed.

Figure 11:
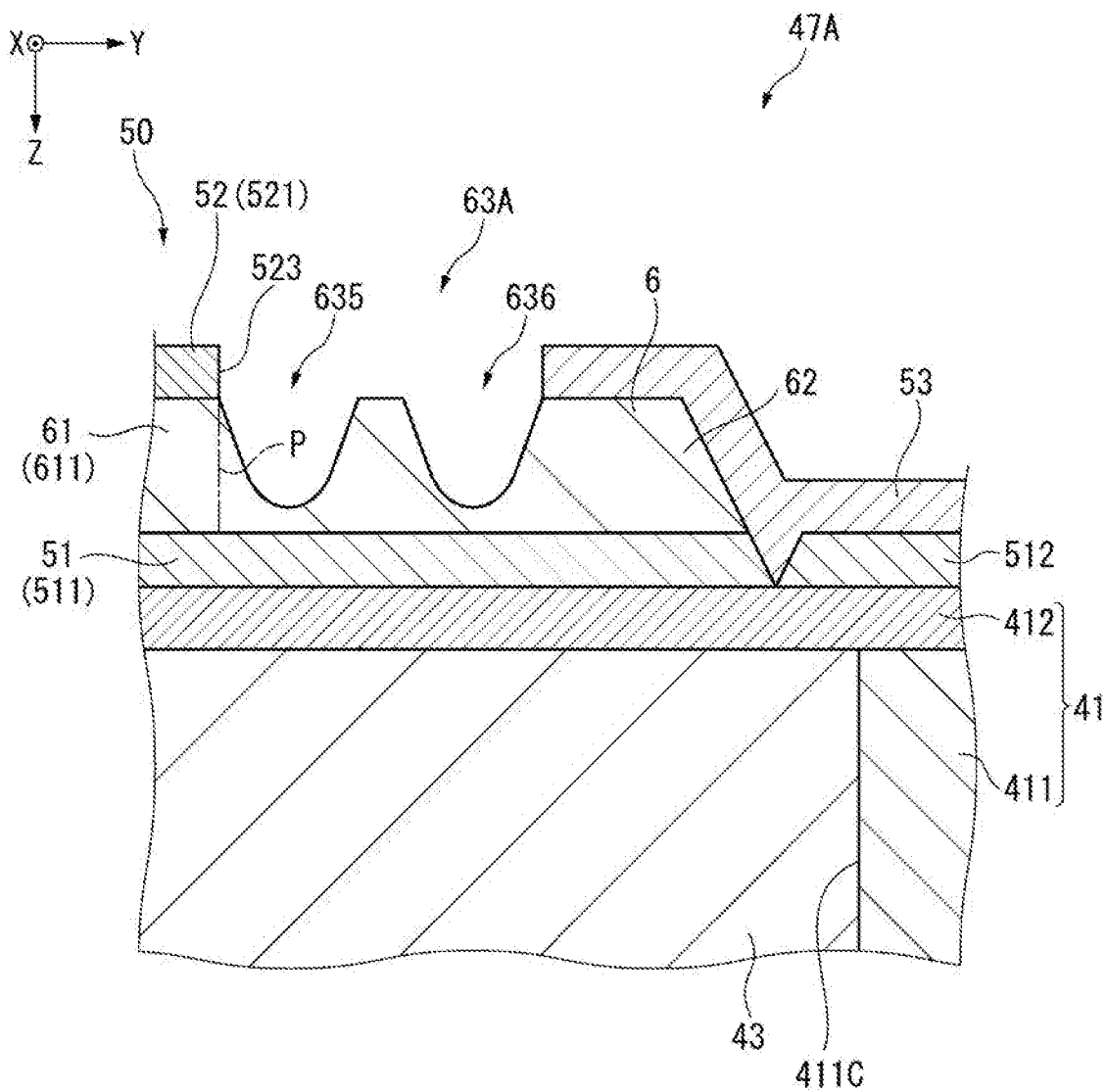
FIG. 11 is a sectional view schematically illustrating an ultrasonic transducer related to still another modification example.

FIG. 11 is a sectional view schematically illustrating an ultrasonic transducer 47A related to a modification example of the second embodiment.

In the ultrasonic transducer 47A illustrated in FIG. 11, a non-coated portion 63A has a first groove 635 and a second groove 636 as a plurality of grooves. The first groove 635 has a curved groove inner surface, and is formed along the end 523 of the upper electrode 52 in a plan view. The second groove 636 has a curved groove inner surface, and is formed along the end of the conductive layer 53 in the Y direction in a plan view. In this configuration, an actual distance between the upper electrode 52 and the conductive layer 53 can be further increased.

In the configuration in which a plurality of grooves as illustrated in FIG. 11 are provided, depth dimensions of the grooves may be increased from the first coated portion 61 side toward the second coated portion 64 side. In this configuration, among a plurality of grooves, the rigidity of the piezoelectric film 6 in the groove on the first coated portion 61 (boundary P) can be increased more than in the groove on the second coated portion 64 side, and thus it is possible to suppress the occurrence of a crack around the boundary P. Since the rigidity on the second coated portion 64 side is reduced, even if a crack occurs, a position where the crack occurs can be separated from the boundary P, and also to more reliably suppress the occurrence of burning.

An embodiment of the invention is not limited to a configuration in which groove inner surfaces of all of a plurality of grooves are curved surfaces, and a groove inner surface of at least one groove may be a curved surface. For example, a corner portion may be formed at a boundary between a groove bottom of the second groove 636 located on the second coated portion 62 side and a groove side surface connected to the groove bottom. In this configuration, it is possible to make the stress concentrate on the corner portion, and thus to suppress the occurrence of a crack around the boundary P. Even if a crack occurs in the corner portion, a position where the crack occurs can be separated from the boundary P, and also to more reliably suppress the occurrence of burning. A corner portion is formed at a boundary between a groove bottom and a groove inner surface located on the second coated portion 62 side in a groove side surface of the second groove 636, and thus a position of the corner portion on which the stress easily concentrates can be separated from the boundary P as described above.

In the first and second embodiments, a description has been made of an exemplary configuration in which a thickness of the second coated portion 62 is the same as a thickness of the first coated portion 61, but this is only an example. For example, a thickness of the second coated portion 62 may be smaller than a thickness of the first coated portion 61. In this configuration, the second coated portion 62 can be easily deformed, and thus it is possible to prevent the stress from concentrating on the non-coated portion 63. Since the second coated portion 62 can be easily deformed, it is possible to improve the transmission/reception sensitivity of the ultrasonic transducer 45.

In the first and second embodiments, a description has been made of an exemplary configuration in which the groove is formed from the first coated portion 61 to the second coated portion 62 in a plan view, but this is only an example. For example, the groove may be partially formed between the first coated portion 61 and the second coated portion 62.

The groove in the first and second embodiments and the gradually reduced part in the third embodiment are formed along the end 523 of the upper electrode 52, but this is only an example.

For example, the groove or the gradually reduced part may be formed at a position along the end of the upper electrode main body portion 521 forming at least the active section 50. In other words, a thickness of the piezoelectric film may be smaller than a thickness of the first coated portion 61 at a position along the end of at least the upper electrode main body portion 521 in a plan view. Also in this configuration, the stress generated in the piezoelectric film during driving can be prevented from concentrating on the position along the end of the active section 50 in the non-coated portion 63, and thus it is possible to suppress the occurrence of a crack in the piezoelectric film.

In the second embodiment, the entire inner surface of the groove is a curved surface, but, for example, the corner portion which is a boundary between the groove bottom 631A and the first groove side surface 631B and the corner portion which is a boundary between the groove bottom 631A and the second groove side surface 631C in the first embodiment may be curved. A part of the conductive layer 53 may be formed on the inner surface of the groove in the first and second embodiments, and, that is, the groove may be formed over the second coated portion.

In the first embodiment or the second embodiment, for example, a protection member for suppressing a crack of the groove bottom may be provided in the groove. The protection member may be formed in a film form along the inner circumferential surface of the groove, and may fill the groove. As the protection member, for example, an elastic non-conductive material is used. As the protection member, for example, a resin material such as silicon may be used.

In the respective embodiments, a description has been made of an exemplary configuration in which the non-coated portion has the gradually reduced part, but this is only an example. In other words, a thickness of the non-coated portion at the position including the boundary P may be smaller than a thickness of the first coated portion 61, and a step difference may be formed at the boundary P between the first coated portion 61 and the non-coated portion. Also in this configuration, the non-coated portion can be easily deformed.

An embodiment of the invention is not limited to the configuration in which a thickness of the non-coated portion at the position including the boundary P is smaller than a thickness of the first coated portion 61, and a thickness of the non-coated portion at the position including the boundary P may be the same as a thickness of the first coated portion 61, and a thickness of the non-coated portion at a position not including the boundary P may be smaller than a thickness of the first coated portion 61. A thickness around the boundary between the non-coated portion and the second coated portion may be the same as a thickness of the second coated portion, and a thickness of a remaining portion may be smaller than a thickness of the second coated portion. Also in this case, a thickness of at least a part of the non-coated portion is made smaller than a thickness of the first coated portion 61, and thus the non-coated portion can be easily deformed.

In the respective embodiments, the upper electrode 52 and the conductive layer 53 are made of a metal material, but are not limited thereto. For example, the upper electrode 52 and the conductive layer 53 may be formed by using a tin oxide-based conductive material such as indium tin oxide (ITO) or fluorine-doped tin oxide (FTO), a zinc oxide-based conductive material, an oxide conductive material such as strontium ruthenate ($SrRuO_3$), lanthanum nickelate ($LaNiO_3$), or elemental doped strontium titanate, or a conductive polymer.

In the respective embodiments, the active section 50 of the piezoelectric element 5 is formed inside the outer circumferential edge of the opening 411C (flexible portion 412C) in a plan view, but is not limited thereto. For example, the outer circumferential edge of the active section 50 may be located outside the outer circumferential edge of the opening 411C (flexible portion 412C). In other words, the coated portion may be formed on the wall portion 411D.

In the respective embodiments, a description has been made of an exemplary configuration in which the piezoelectric element 5 and the sealing plate 42 are provided on the vibration film 412 on an opposite side to the substrate main body portion 411 (opening 411C), the acoustic layer 43 and the acoustic lens 44 are provided on the substrate main body portion 411, and an ultrasonic wave is transmitted and received from the surface on the substrate main body portion 411 side, but this is only an example. For example, there may be a configuration in which the piezoelectric element 5, the acoustic layer 43, and the acoustic lens 44 are provided on the vibration film 412 on an opposite side to the substrate main body portion 411, the sealing plate 42 (reinforcement plate) is provided on the substrate main body portion 411 side, and an ultrasonic wave is transmitted and received from a surface opposite side to the substrate main body portion 411.

In the embodiments, as an electronic apparatus, a description has been made of an exemplary configuration in which the ultrasonic apparatus employs an organ in a living body as a measurement target, but the invention is not limited thereto. For example, the configurations of the embodiments and each modification example are applicable to a measurement apparatus which employs various structural bodies as measurement targets, and detects defects of the structural bodies or examines deterioration thereof. For example, the configurations of the embodiments and each modification example are applicable to a measurement apparatus which employs various semiconductor packages, wafers, or the like as measurement targets, and detects defects of the measurement targets. The configurations of the embodiments and each modification example are applicable to a recording device including an ink jet head discharging ink droplets by driving a piezoelectric element.

Figure 12:
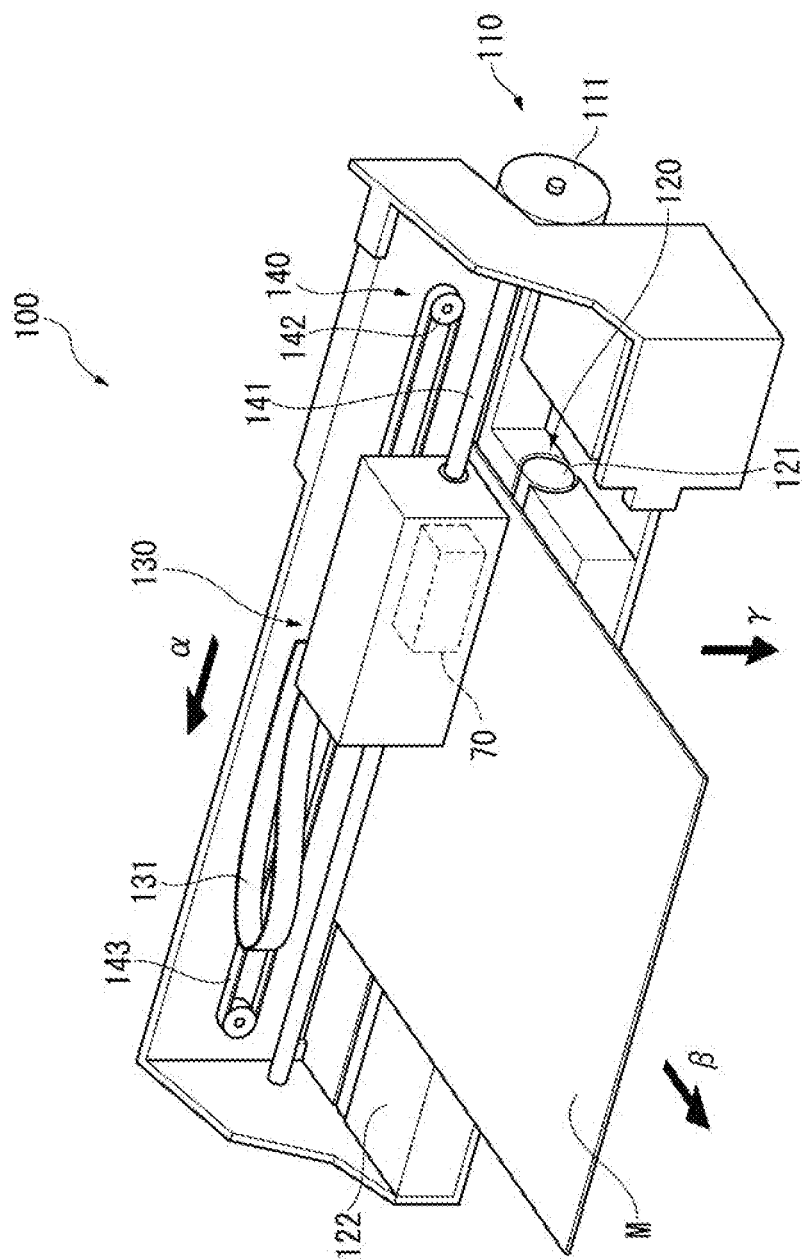
FIG. 12 is a diagram illustrating a schematic configuration of a printer related to a modification example of the invention.
Figure 13:
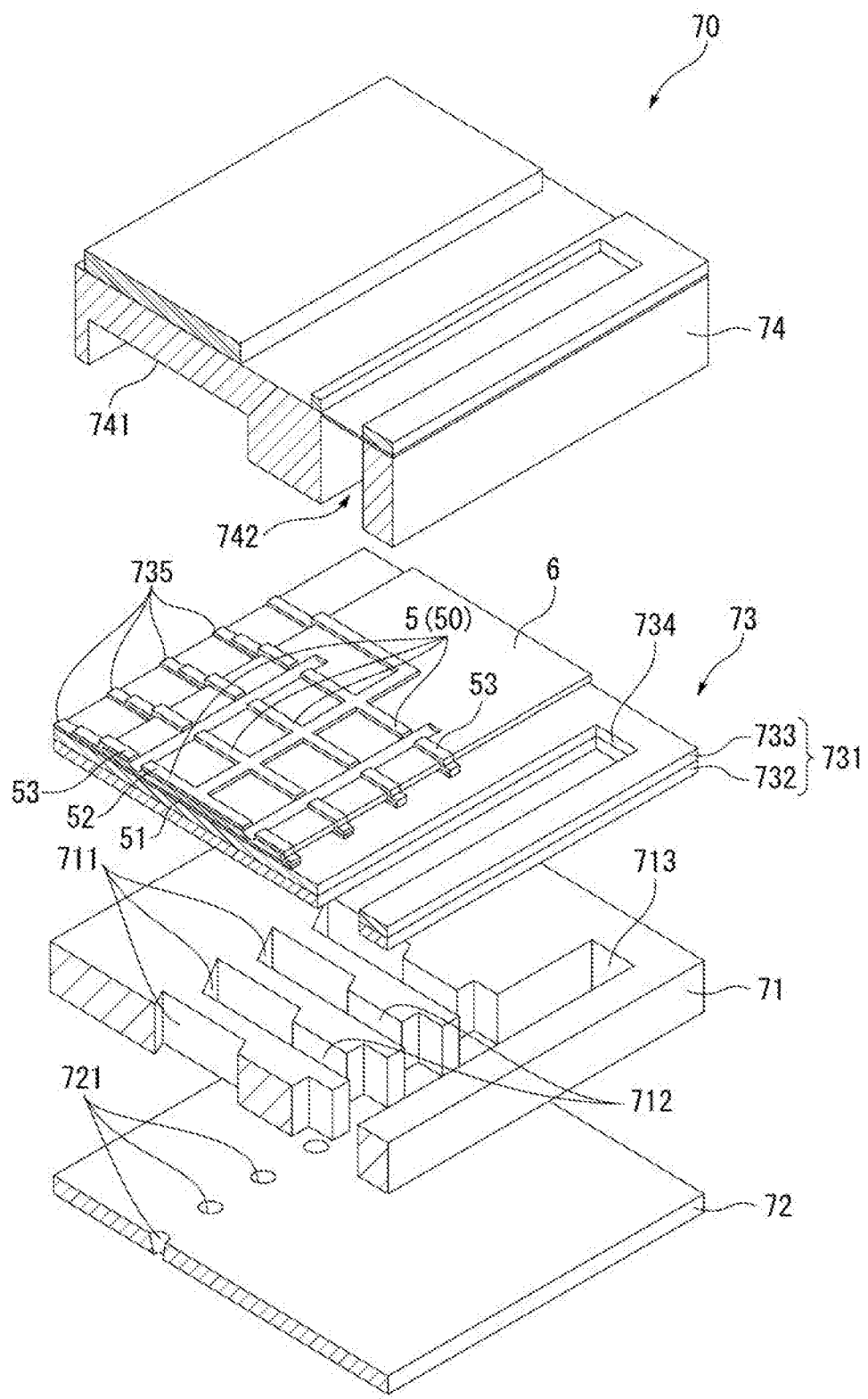
FIG. 13 is an exploded perspective view schematically illustrating a recording head included in the printer.

FIG. 12 is a diagram illustrating a configuration example of an exterior of a printer 100 which is an application example of a recording device including the piezoelectric element of the embodiments of the invention. FIG. 13 is an exploded perspective view schematically illustrating a recording head 70 included in the printer 100.

The printer 100 corresponds to a liquid ejection device, and includes, as illustrated in FIG. 12, a feed unit 110 which feeds a medium, a transport unit 120 which transports a medium, a carriage 130 to which the recording head 70 is attached, a carriage moving unit 140 which moves the carriage 130, and a control unit (not illustrated) which controls the printer 100. The printer 100 controls the respective units 110, 120 and 140, and the carriage 130 on the basis of printing data which is input from an external apparatus such as a personal computer, and prints an image on a medium M.

The feed unit 110 supplies the medium M to an image formation position. For example, the feed unit 110 is provided with a roll member 111 on which the medium M is wound, a roll drive motor (not illustrated), and roll drive wheel rows (not illustrated). The roll drive motor is driven to be rotated on the basis of a command from the control unit, and torque of the roll drive motor is delivered to the roll member 111 via the roll drive wheel rows. Consequently, the roll member 111 is rotated, and thus a paper sheet wound on the roll member 111 is fed to a downstream side (+β side) in a β direction (sub-scanning direction).

The transport unit 120 transports the medium M fed from the feed unit 110 along the β direction. For example, the transport unit 120 includes a transport roller 121, a driven roller (not illustrated) which is disposed to sandwich the mediumM with the transport roller 121 and follows the transport roller 121, and a platen 122 provided on the downstream side of the transport roller 121 in the β direction. Ina case where drive force is delivered from a transport motor (not illustrated), and the transport motor is driven under the control of the control unit (not illustrated), the transport roller 121 is driven to be rotated by torque, and transports the medium M along the β direction in a state of sandwiching the medium M with the driven roller.

The recording head 70 or the like printing an image on the mediumM is attached to the carriage 130. The recording head 70 or the like is connected to the control unit via a cable 131. The recording head 70 will be described later. The carriage 130 is provided to be movable along an α direction (main scanning direction) intersecting the β direction by the carriage moving unit 140.

The carriage moving unit 140 reciprocally moves the carriage 130 along the α direction. For example, the carriage moving unit 140 includes a carriage guide shaft 141, a carriage motor 142, a timing belt 143, and the like. The carriage guide shaft 141 is disposed along the α direction, and both ends thereof are fixed to a casing of the printer 100. The carriage motor 142 drives the timing belt 143. The timing belt 143 is supported to be substantially parallel to the carriage guide shaft 141, and a part of the carriage 130 is fixed thereto. If the carriage motor 142 is driven on the basis of a command from the control unit, the timing belt 143 forwardly and reversely travels, and thus the carriage 130 fixed to the timing belt 143 is guided along the carriage guide shaft 141 so as to be reciprocally moved.

The recording head 70 corresponds to a liquid ejection head, ejects ink supplied from an ink tank (not illustrated) in a γ direction intersecting the α direction and the β direction, and forms an image on the medium M. As illustrated in FIG. 13, the recording head 70 includes a pressure chamber forming substrate 71, a nozzle plate 72, an actuator unit 73, a sealing plate 74, and the like.

The pressure chamber forming substrate 71 is a plate member formed of, for example, a silicon single crystal substrate. The pressure chamber forming substrate 71 is provided with a plurality of pressure chambers 711, an ink supply channel 712 via which ink is supplied to the pressure chambers 711, and a communication portion 713 which communicates with each pressure chamber 711 via the ink supply channel 712.

The plurality of pressure chambers 711 are provided to correspond to respective nozzles 721 of a nozzle array formed in the nozzle plate 72 on a one-to-one basis as will be described later. In other words, the pressure chambers 711 are formed in the same pitch as a formation pitch of the nozzles 721 along a nozzle array direction.

The communication portion 713 is formed along the plurality of pressure chambers 711. The communication portion 713 communicates with a communication opening 734 of a vibration plate 731 and a liquid chamber space portion 742 of the sealing plate 74 which will be described later, and is filled with ink supplied from the ink tank (not illustrated). The ink filling the communication portion 713 is supplied to the pressure chamber 711 via the ink supply channel 712. In other words, the communication portion 713 forms a reservoir (common liquid chamber) which is an ink chamber common to the respective pressure chambers 711.

The ink supply channel 712 is formed to be narrower than the pressure chamber 711, and is a portion serving as a channel resistor against ink which flows into the pressure chamber 711 from the communication portion 713.

The nozzle plate 72 is provided with a nozzle array formed of plurality of nozzles 721, and is joined to one surface (a surface opposite side to the actuator unit 73) of the pressure chamber forming substrate 71. The plurality of nozzles 721 are formed at a pitch corresponding to a dot formation density (for example, 300 dpi). The nozzle plate 72 is formed by using, for example, glass ceramics, a silicon single crystal substrate, or stainless steel.

The actuator unit 73 is configured to include the vibration plate 731 provided on the pressure chamber forming substrate 71 on an opposite side to the nozzle plate 72, and the piezoelectric element 5 laminated on the vibration plate 731.

The vibration plate 731 includes an elastic film 732 formed on the pressure chamber forming substrate 71 and an insulator film 733 formed on the elastic film 732. As the elastic film 732, for example, silicon dioxide ($SiO_2$) with the thickness of 300 nm to 2000 nm is preferably used. As the insulator film 733, for example, zirconium oxide ($ZrO_x$) with the thickness of 30 nm to 600 nm is preferably used. A region of the vibration plate 731 covering the pressure chamber 711 is a region (flexible portion) which is permitted to be bent and deformed in directions of contacting with and separating from the nozzle 721 when the piezoelectric element 5 is driven. A portion of the vibration plate 731 corresponding to the communication portion 713 of the pressure chamber forming substrate 71 is provided with the communication opening 734 communicating with the communication portion 713.

As described above, the piezoelectric element 5 includes the lower electrode 51, the piezoelectric film 6, the upper electrode 52, and the conductive layer 53 laminated in this order. The piezoelectric element 5 is provided at a position corresponding to the pressure chamber 711, and forms a piezoelectric actuator along with the flexible portion which is a region of the vibration plate 731 closing the pressure chamber 711. Although not illustrated, the lower electrode 51 and the upper electrode 52 are connected to electrode terminals formed in the terminal region via lead electrodes 735.

FIG. 13 exemplifies a configuration in which a groove is formed over non-coated portions of a plurality of piezoelectric elements 5 disposed in one direction, but this is only an example, and a groove may be separately formed in each piezoelectric element 5.

The sealing plate 74 is joined to a surface of the actuator unit 73 on an opposite side to the pressure chamber forming substrate 71. A storage space portion 741 in which the piezoelectric elements 5 can be stored is formed on a surface of the sealing plate 74 on the actuator unit 73 side. The liquid chamber space portion 742 is provided in a region of the sealing plate 74 corresponding to the communication opening 734 and the communication portion 713. The liquid chamber space portion 742 communicates with the communication opening 734 and the communication portion 713, and forms a reservoir serving as an ink chamber common to the respective pressure chambers 711. Although not illustrated, the sealing plate 74 is provided with wiring openings which penetrate in the thickness direction, at a position corresponding to the terminal region of the actuator unit 73. The electrode terminals of the terminal region are exposed to the wiring openings. The electrode terminals are connected to a wiring member (not illustrated) connected to a printer main body.

In the recording head 70 having such a configuration, ink is incorporated from an ink cartridge, and a channel from the reservoir to the nozzle 721 via the ink supply channel 712, and the pressure chamber 711 is filled with the ink. If a drive signal is supplied from the printer main body side, and thus each piezoelectric element 5 corresponding to the pressure chamber 711 is driven, the region (flexible portion) of the vibration plate 731 corresponding to the pressure chamber 711 is displaced, and thus a pressure change occurs in the pressure chamber 711. The ink is ejected from the nozzle 721 by controlling the pressure change.

In the respective embodiments, the ultrasonic transducer 45 including the flexible portion 412C corresponding to a drive portion and the piezoelectric element 5 which causes the flexible portion 412C to vibrate has been exemplified, but is not limited thereto. In other words, the piezoelectric element of the embodiments of the invention may be applied to a piezoelectric actuator including drive portions other than a vibration film. For example, the piezoelectric element of the embodiments of the invention is appropriately applicable to a mirror device or the like in which a reflection film is provided as a drive portion, and a direction or a curvature of the reflection film is changed by driving the piezoelectric element.

A specific structure at the time of implementing the invention may be configured by combining the respective embodiments and modification examples with each other as appropriate within the scope of being capable of achieving the object of the invention, and may be altered to other structures as appropriate.

The entire disclosure of Japanese Patent Application No. 2017-006213 filed Jan. 17, 2017 is expressly incorporated by reference herein.

What is claimed is:

1. A piezoelectric element comprising:
    a first electrode layer;
    a piezoelectric body layer laminated on the first electrode layer;
    a second electrode layer laminated on the piezoelectric body layer; and
    a conductive layer that overlaps the first electrode layer and the piezoelectric body layer,
    wherein the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and
    wherein a thickness of at least a part of the third portion is smaller than a thickness of the first portion.

2. The piezoelectric element according to claim 1, wherein a thickness of the third portion is smaller than a thickness of the first portion at a position including at least a boundary with the first portion in the plan view.

3. The piezoelectric element according to claim 2, wherein a thickness of the third portion is gradually reduced as the third portion becomes more distant from the boundary in the plan view.

4. The piezoelectric element according to claim 1, wherein the third portion has a groove located between the first portion and the second portion in the plan view.

5. The piezoelectric element according to claim 4, wherein an inner surface of the groove is curved.

6. The piezoelectric element according to claim 1, wherein a thickness of at least a part of the second portion is smaller than a thickness of the first portion.

7. A piezoelectric actuator comprising:
    a piezoelectric element in which a first electrode layer, a piezoelectric body layer, and a second electrode layer are laminated in this order; and
    a drive portion that is driven by the piezoelectric element, wherein the piezoelectric element includes a conductive layer that overlaps the first electrode layer and the piezoelectric body layer, wherein the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and wherein a thickness of at least a part of the third portion is smaller than a thickness of the first portion.

8. The piezoelectric actuator according to claim 7, wherein the drive portion is a vibration film, and wherein the piezoelectric element is provided on the vibration film.

9. An ultrasonic apparatus comprising:

a vibration film;

a piezoelectric element in which a first electrode layer, a piezoelectric body layer, and a second electrode layer are laminated in this order on the vibration film; and a controller that controls the piezoelectric element, wherein the piezoelectric element includes a conductive layer that overlaps the first electrode layer and the piezoelectric body layer, wherein the piezoelectric body layer includes a first portion overlapping the second electrode layer, a second portion overlapping the conductive layer, and a third portion not overlapping the second electrode layer and the conductive layer, in a plan view which is viewed from a laminate direction of the first electrode layer, the piezoelectric body layer, and the second electrode layer, and wherein a thickness of at least a part of the third portion is smaller than a thickness of the first portion.

* * * * *